United States Patent
Baraskar et al.

(10) Patent No.: US 9,779,948 B1
(45) Date of Patent: Oct. 3, 2017

(54) METHOD OF FABRICATING 3D NAND

(71) Applicant: SanDisk Technologies LLC, Plano, TX (US)

(72) Inventors: Ashish Baraskar, Santa Clara, CA (US); Yanli Zhang, San Jose, CA (US); Ching-Huang Lu, Fremont, CA (US); Zhenyu Lu, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/185,866

(22) Filed: Jun. 17, 2016

(51) Int. Cl.
| | |
|---|---|
| *H01L 21/28* | (2006.01) |
| *H01L 27/11519* | (2017.01) |
| *H01L 27/11565* | (2017.01) |
| *H01L 27/11524* | (2017.01) |
| *H01L 27/1157* | (2017.01) |
| *H01L 27/11556* | (2017.01) |
| *H01L 27/11582* | (2017.01) |

(52) U.S. Cl.
CPC .... *H01L 21/28282* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
CPC ......... H01L 21/28282; H01L 27/11519; H01L 27/11524; H01L 27/1157
See application file for complete search history.

(56) References Cited

U.S. PATENT DOCUMENTS

| | | |
|---|---|---|
| 5,532,185 A | 7/1996 | Akamine et al. |
| 8,865,535 B2 | 10/2014 | Rabkin et al. |
| 8,940,592 B2 | 1/2015 | Qin et al. |
| 8,964,473 B2 | 2/2015 | Dong et al. |
| 9,018,064 B2 | 4/2015 | Waite et al. |
| 9,129,681 B2 | 9/2015 | Rabkin et al. |
| 9,136,282 B2 | 9/2015 | Qin et al. |

(Continued)

OTHER PUBLICATIONS

Turbbaugh, Dean, et al., "Advances in Plasma Doping on FinFETS and other Applications Using PULSION," Semicon West 2014—San Francisco, Powerpoint slides, Jul. 2014, 31 pages.

(Continued)

*Primary Examiner* — Caleb Henry
*Assistant Examiner* — Mounir Amer
(74) *Attorney, Agent, or Firm* — Vierra Magen Marcus LLP

(57) ABSTRACT

Disclosed herein are methods of fabricating a source side select (SGS) transistor in 3D memory. The threshold voltage of the SGS transistor accurately meets a target threshold voltage. The SGS transistor has a semiconductor body that resides in a memory hole formed in a stack of alternating layers of two materials. During fabrication, a sacrificial layer may be removed to create recesses between dielectric layers in a stack. The sacrificial layer may be removed by introducing an etchant into slits formed in the stack. Thus, the recess may expose sidewalls of the body of the SGS transistor. An impurity may be introduced into this recess, by way of a slit, in order to dope the source side select transistor. This allows for precise control over the doping profile, which in turn provides for precise control over the threshold voltage of the SGS transistor.

20 Claims, 23 Drawing Sheets

(56) References Cited

U.S. PATENT DOCUMENTS

| | | | |
|---|---|---|---|
| 2013/0126957 A1 | 5/2013 | Higashitani et al. | |
| 2017/0069636 A1* | 3/2017 | Park | H01L 27/1157 |
| 2017/0069652 A1* | 3/2017 | Arai | H01L 27/11582 |

OTHER PUBLICATIONS

Felch, Susan, "Doping FinFETs: Trade-offs for Beamline Implantation, Plasma Doping, and Diffusion from Doped Epi/CVD Films," Powerpoint slides, Oct. 14, 2014, 29 pages.

Oh, Jae-Geun, et al., "Characterization of B2H6 Plasma Doping for Converted p+ Poly-Si Gate," American Institute of Physics, Nov. 2006, 4 pages.

Jones, Scotten W., "Diffusion in Silicon," ICKnowledge LLC, Apr. 25, 2008, 71 pages.

Lenoble, Damien, "Plasma Doping as an Alternative Route for Ultra-Shallow Junction Integration to Standard CMOS Technologies," STMicroelectronics, Semiconductor FabTech, 16th Ed., Apr. 2002, 5 pages.

Nishizawa, J., et al., "Ultrashallow, high doping of boron using molecular layer doping," Applied Physics Letters, Jan. 1990, 3 pages.

* cited by examiner

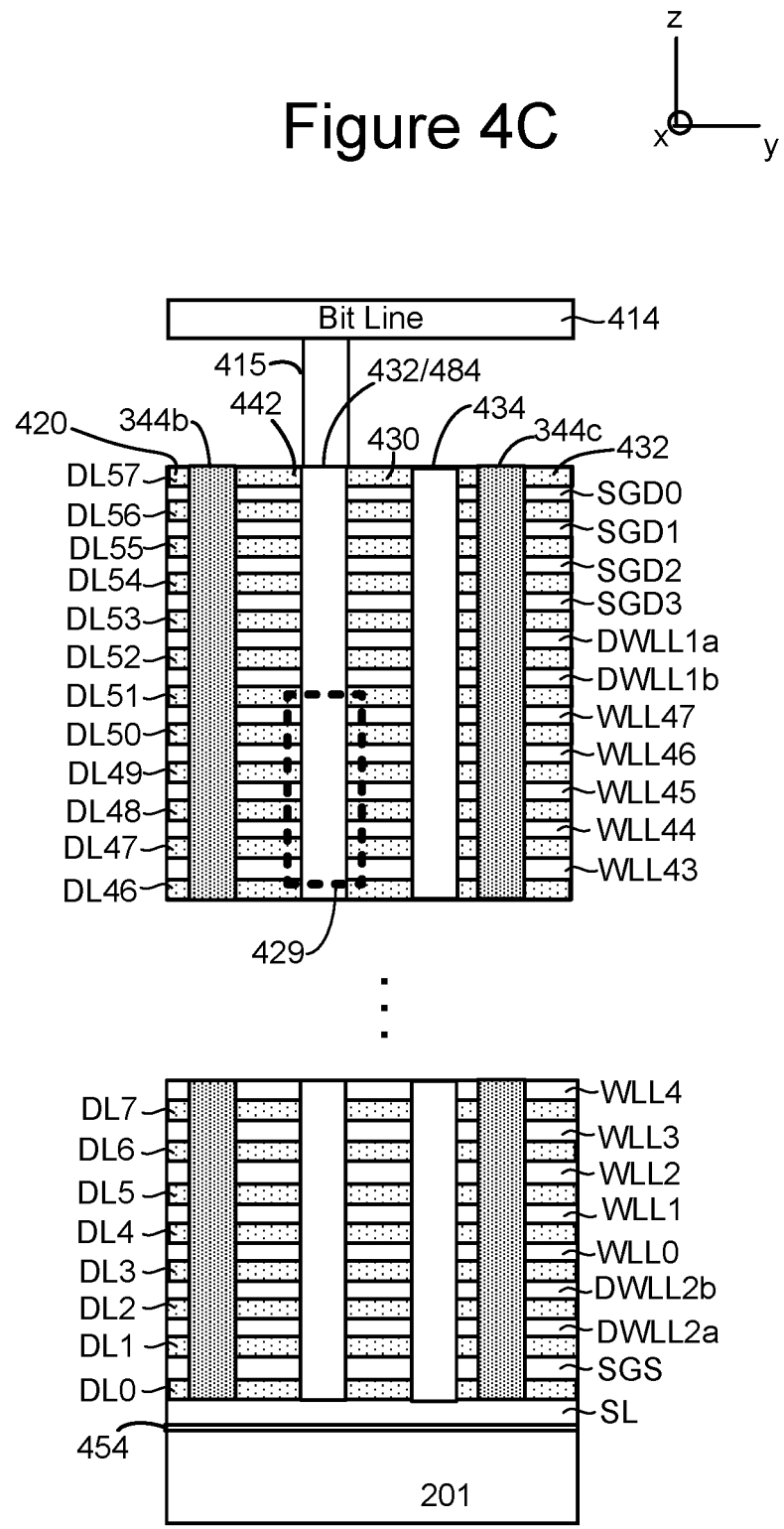

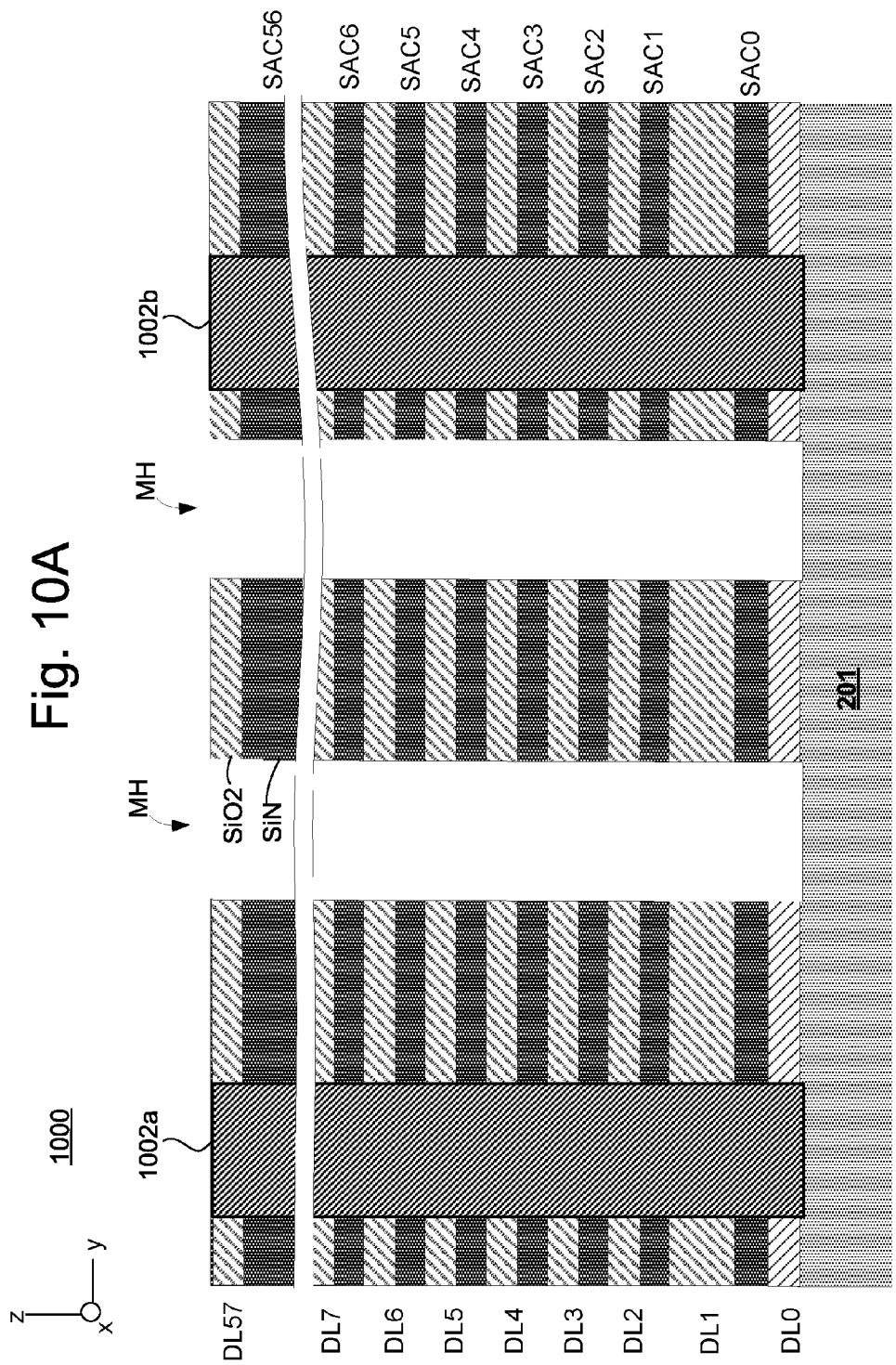

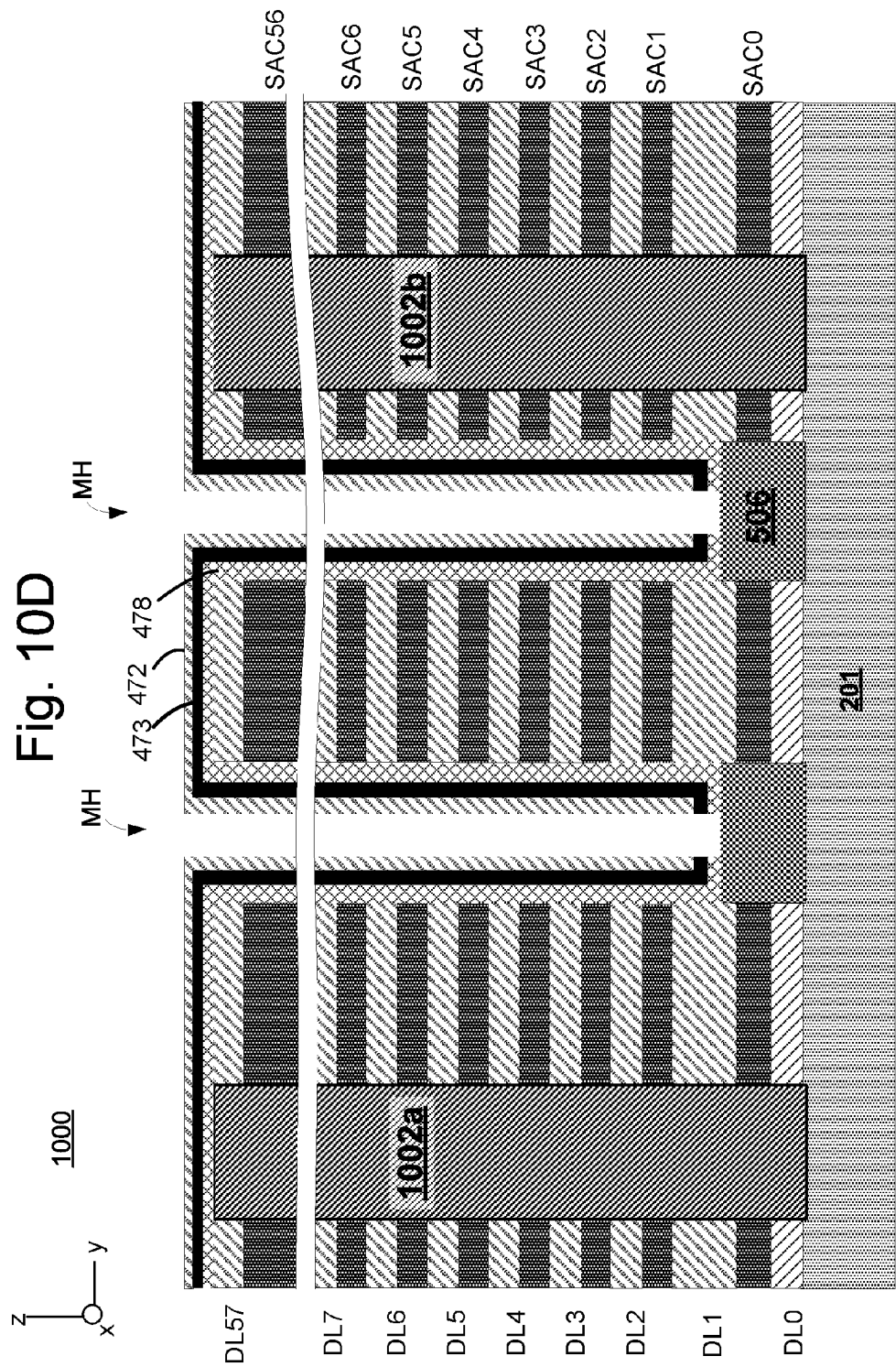

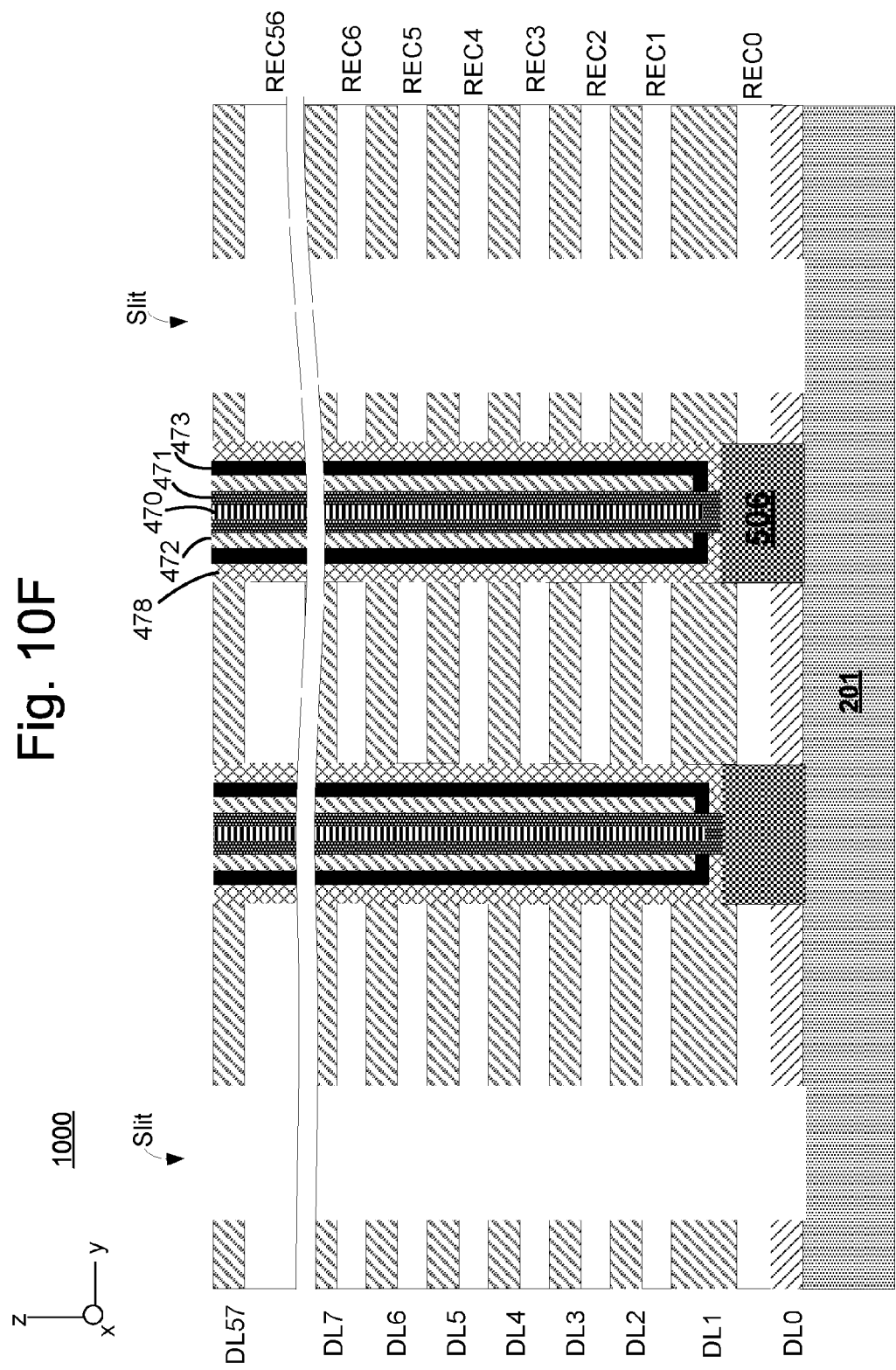

METHOD OF FABRICATING 3D NAND

BACKGROUND

The present technology relates to non-volatile memory.

Recently, ultra high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. In one technique, a memory hole is drilled in the layers to define many memory layers simultaneously. A NAND string is then formed by filling the memory hole with appropriate materials. Control gates of the memory cells are provided by the conductor layers. Select gates are formed at either end of the memory hole.

BRIEF DESCRIPTION OF THE DRAWINGS

Like-numbered elements refer to common components in the different figures.

FIG. 4C depicts a portion of an embodiment of three dimensional memory structure showing a cross-sectional view along line AA of FIG. 4B.

FIGS. 10A-10J depict results after various steps of FIG. 9.

DETAILED DESCRIPTION

Disclosed herein are methods of fabricating 3D memory with vertical NAND strings, each having a source side select transistor. The threshold voltage of the source side select transistor may be important for efficient and accurate operation of the memory array. The threshold voltage of the source side select transistor may play a role in read disturb. If the threshold voltage is off from a target value read disturb of memory cells near the source side select transistor may increase. Techniques disclosed herein are able to fabricate a source side select transistor having a threshold voltage that accurately meets a target threshold voltage. Thus, memory array operations may be more efficient and more accurate. For example, read disturb may be reduced or prevented.

The source side select transistor has a semiconductor body that resides in a memory hole formed in a stack of alternating layers of two materials, in one embodiment. When fabrication is complete, one material in the stack may be a dielectric and the other a conductor. Thus, after completion the stack may include alternating dielectric and conductive layers. One of the conductive layers may be used for the control gate of the source side select transistor. However, during fabrication, the stack may initially comprise alternating dielectric and sacrificial layers. At one point in fabrication, the sacrificial layers may be removed to create recesses between the dielectric layers. In one embodiment, the sacrificial layers are removed by introducing an etchant into slits formed in the stack. Thus, one of the recesses may exposes sidewalls of the semiconductor body of the source side select transistor. An impurity may be introduced into this recess, by way of one of the slits, in order to dope the source side select transistor. This allows for precise control over the doping profile, which in turn provides for precise control over the threshold voltage of the source side select transistor.

Figure 1:
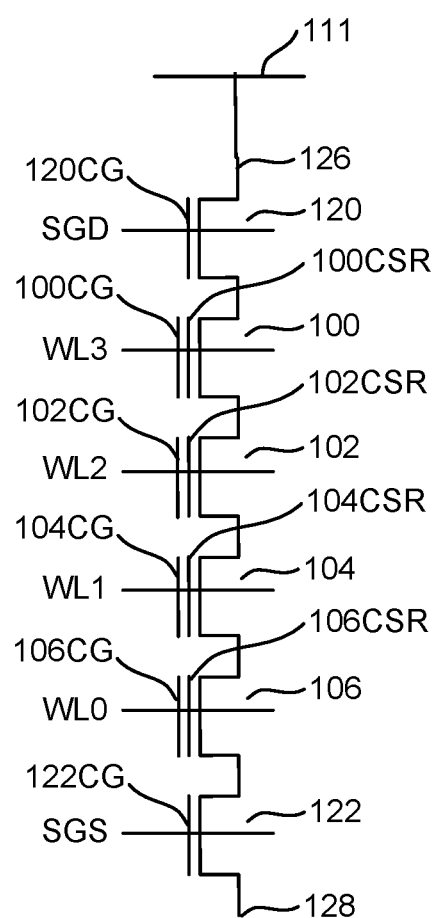
FIG. 1 is a circuit representation of a NAND string.

One example of a non-volatile storage system that can implement the technology described herein is a flash memory system that uses the NAND structure, which includes arranging multiple memory cell transistors in series, sandwiched between two select transistors. The memory cell transistors in series and the select transistors are referred to as a NAND string. FIG. 1 is a circuit representation of a NAND string. The NAND string depicted in FIG. 1 includes four memory cell transistors 100, 102, 104 and 106 in series and sandwiched between (drain side) select transistor 120 and (source side) select transistor 122. Select transistor 120 connects the NAND string to a bit line 111. Select transistor 122 connects the NAND string to source line 128. Select transistor 120 is controlled by applying the appropriate voltages to select line SGD. The select line (SGD) is connected to a control gate terminal 120CG of the select transistor 120. Select transistor 122 is controlled by applying the appropriate voltages to select line SGS. The select line (SGS) is connected to a control gate terminal 122CG of the select transistor 122. Note that there may be more than one select transistor at each end of the NAND string, which work together as a switch to connect/disconnect the NAND string to and from the bit line and source line. For example, there may be multiple select transistors in series at each end of the NAND string.

Each of the memory cell transistors 100, 102, 104 and 106 has a control gate (CG) and a charge storage region (CSR). For example, memory cell transistor 100 has control gate 100CG charge storage region 1600CSR. Memory cell transistor 102 includes control gate 102CG and a charge storage region 102CSR. Memory cell transistor 104 includes control gate 104CG and charge storage region 104CSR. Memory cell transistor 106 includes a control gate 106CG and a charge storage region 106CSR. Control gate 100CG is connected to word line WL3, control gate 102CG is connected to word line WL2, control gate 104CG is connected to word line WL1, and control gate 106CG is connected to word line WL0.

Note that although FIG. 1 shows four memory cells in the NAND string, the use of four memory cells is only provided as an example. A NAND string can have fewer than four memory cells or more than four memory cells. The discussion herein is not limited to any particular number of memory cells in a NAND string. One embodiment uses NAND strings with some memory cells are used to store data and one or more of the memory cells are referred to as dummy memory cells because they do not store data.

A typical architecture for a flash memory system using a NAND structure will include many NAND strings. Each NAND string may be connected to the common source line by its source select transistor controlled by select line SGS and connected to its associated bit line by its drain select transistor controlled by select line SGD. Bit lines may be shared with multiple NAND strings. The bit line may be connected to a sense amplifier.

The charge storage region (CSR) may utilize a non-conductive dielectric material to store charge in a non-volatile manner. In one embodiment, a triple layer dielectric formed of oxide-nitride-oxide ("ONO") is sandwiched between a conductive control gate and the memory cell channel. As one example, the ONO is silicon oxide, silicon nitride and silicon oxide. As another example, the ONO may be $Al_2O_3$—SiN—$SiO_2$. In the direction from the control gate toward the NAND channel, the first oxide (e.g., $Al_2O_3$) forms at least a portion of a blocking layer, which blocks un-desirable tunneling of electrons from CSR to control gate or from control gate to CSR. The silicon nitride is a charge trapping layer or charge storage region (CSR), in one embodiment. The second oxide (e.g., $SiO_2$) is tunneling dielectric through which electron can tunnel from the channel to the CSR during programming. The blocking layer can be a stack of dielectrics, e.g. $Al_2O_3$—$SiO_2$ in the direction from control gate toward the NAND channel, in one embodiment. The tunneling layer can be a stack of different dielectric films, e.g. $SiO_2$—SiN—$SiO_2$, in one embodiment. The cell is programmed by injecting electrons from the cell channel (or NAND string channel) into the nitride, where they are trapped and stored in a limited region. This stored charge then changes the threshold voltage of the cell in a manner that is detectable. The cell may be erased by injecting holes into the nitride. Cells may be erased by injecting holes into the nitride where they recombine with electrons, and thereby "cancel" or reduce the stored charge. Cells may be also erased by extracting electrons from the nitride, e.g., by applying an electric field making electrons tunnel from nitride to the channel. Cells may be erased by both these mechanisms combined.

Numerous types of materials can be used for the charge storage regions (CSR). In one embodiment, the charge storage regions are conductive floating gates. As one example, the conductive floating gate is formed from polysilicon. This may be heavily doped polysilicon. Other types of non-volatile memory technologies can also be used.

Figure 2:
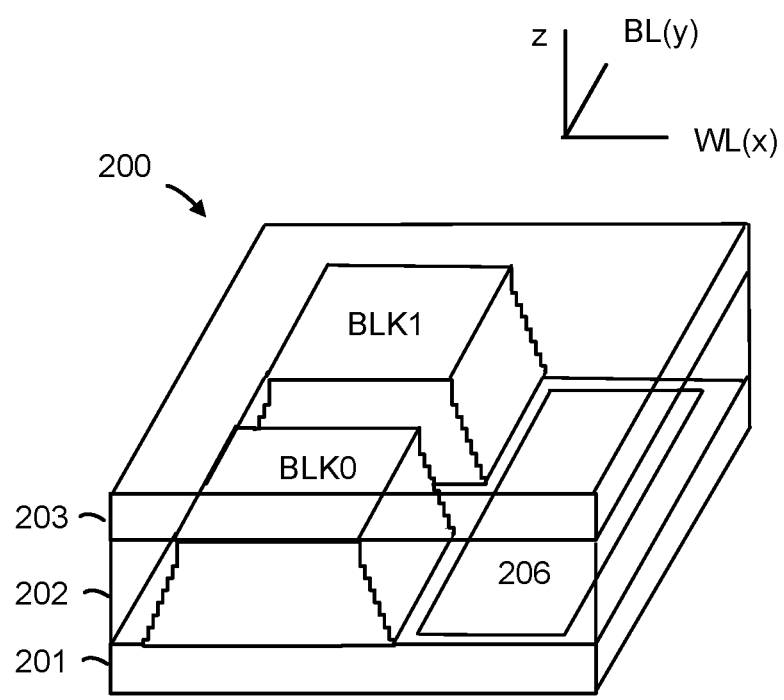
FIG. 2 is a perspective view of a 3D stacked non-volatile memory device.

FIG. 2 is a perspective view of a 3D stacked non-volatile memory device. The 3D memory device 200 includes a substrate 201. In one embodiment, the substrate 201 is formed from silicon. Thus, the substrate 201 may be a semiconductor substrate. The substrate 201 may be a semiconductor wafer. The substrate 201 has a major surface that extends in the x-y plane. On the substrate are example blocks BLK0 and BLK1 of memory cells and a peripheral area 206 with circuitry for use by the blocks. The substrate 201 can also carry circuitry under the blocks, along with one or more lower metal layers which are patterned in conductive paths to carry signals of the circuitry. The blocks are formed in an intermediate region 202 of the memory device. The circuitry associated with operation of the memory cells may be above or within the substrate 201. In one embodiment, the non-volatile memory device is monolithically formed in one or more physical levels of arrays of memory cells having an active area disposed above the substrate 201.

In an upper region 203 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. An x-y-z coordinate system is depicted, showing a y-direction (or bit line (BL) direction), an x-direction (or word line (WL) direction), as well as a z-direction. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 3:
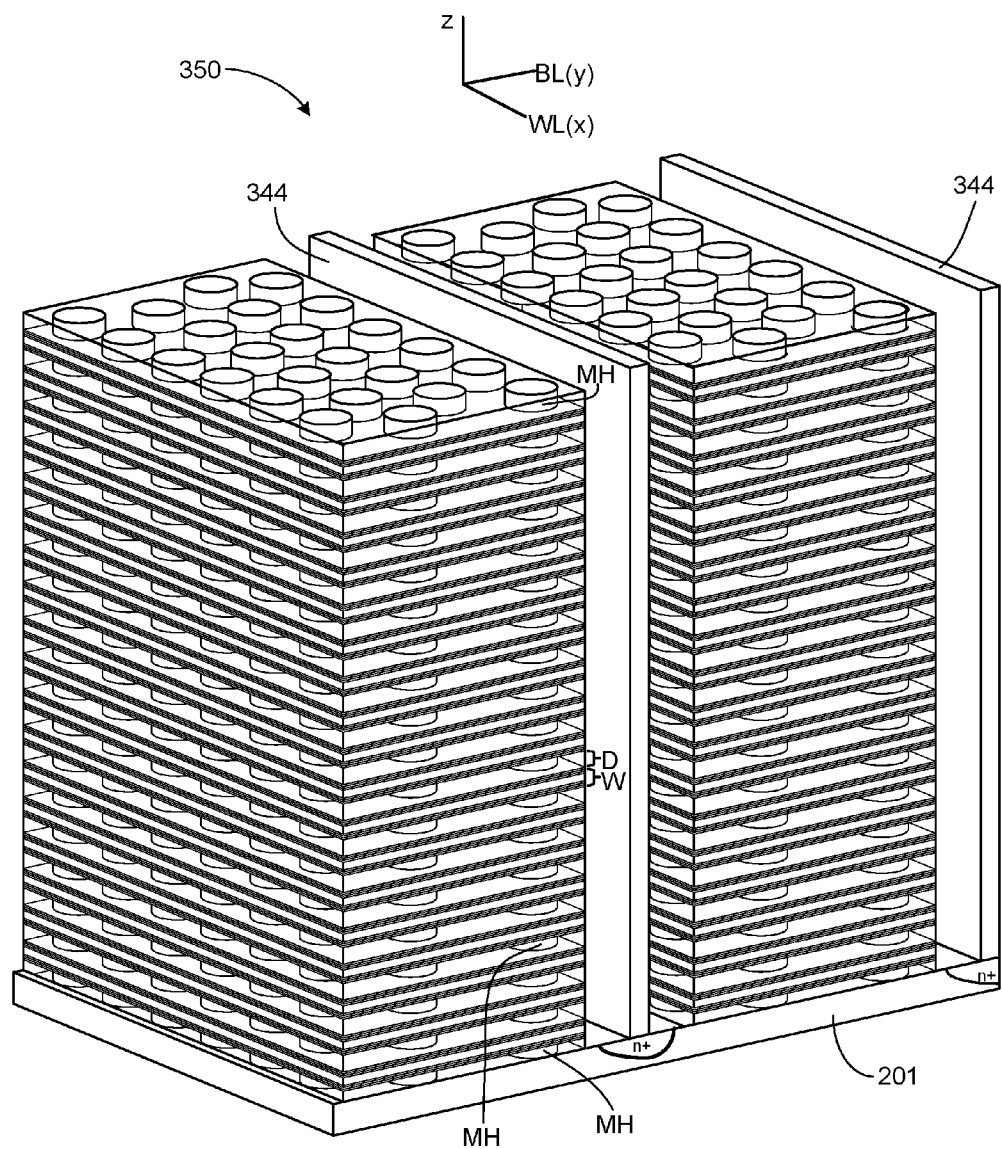
FIG. 3 is a perspective view of a portion of a three dimensional monolithic memory structure.

FIG. 3 is a perspective view of a portion of a three dimensional monolithic memory structure 350, which includes a plurality memory cells. For example, FIG. 3 shows a portion of one block of memory. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or fewer than 108-216 layers can also be used. The alternating dielectric layers and conductive layers are divided into "fingers" by local source lines 344. Note that the local source lines 344 may also be referred to as local interconnects LI. FIG. 3 only shows two fingers and two local interconnects LI. The local source lines 344 are conductive elements. Below and the alternating dielectric layers and word line layers is a substrate 201. Each local source line 344 is in electrical contact with an n+ diffusion region of the substrate 201, in one embodiment. Note that the local source lines 344 each have a major plane that extends in the x-z plane.

Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data.

Figure 4A:
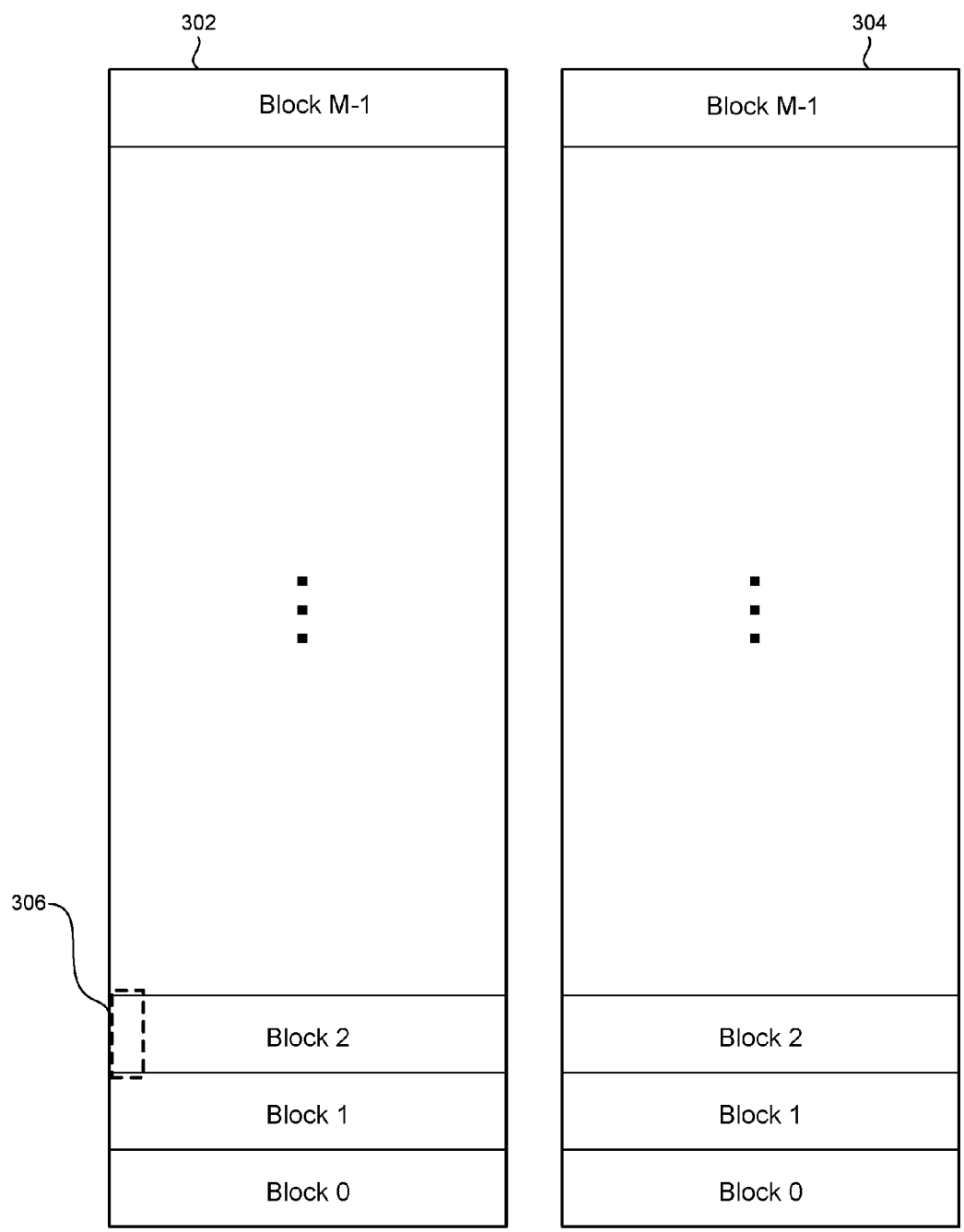
FIG. 4A is a block diagram explaining one example organization of memory structure.

FIG. 4A is a block diagram explaining one example organization of memory structure 350, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . .

Figure 4B:
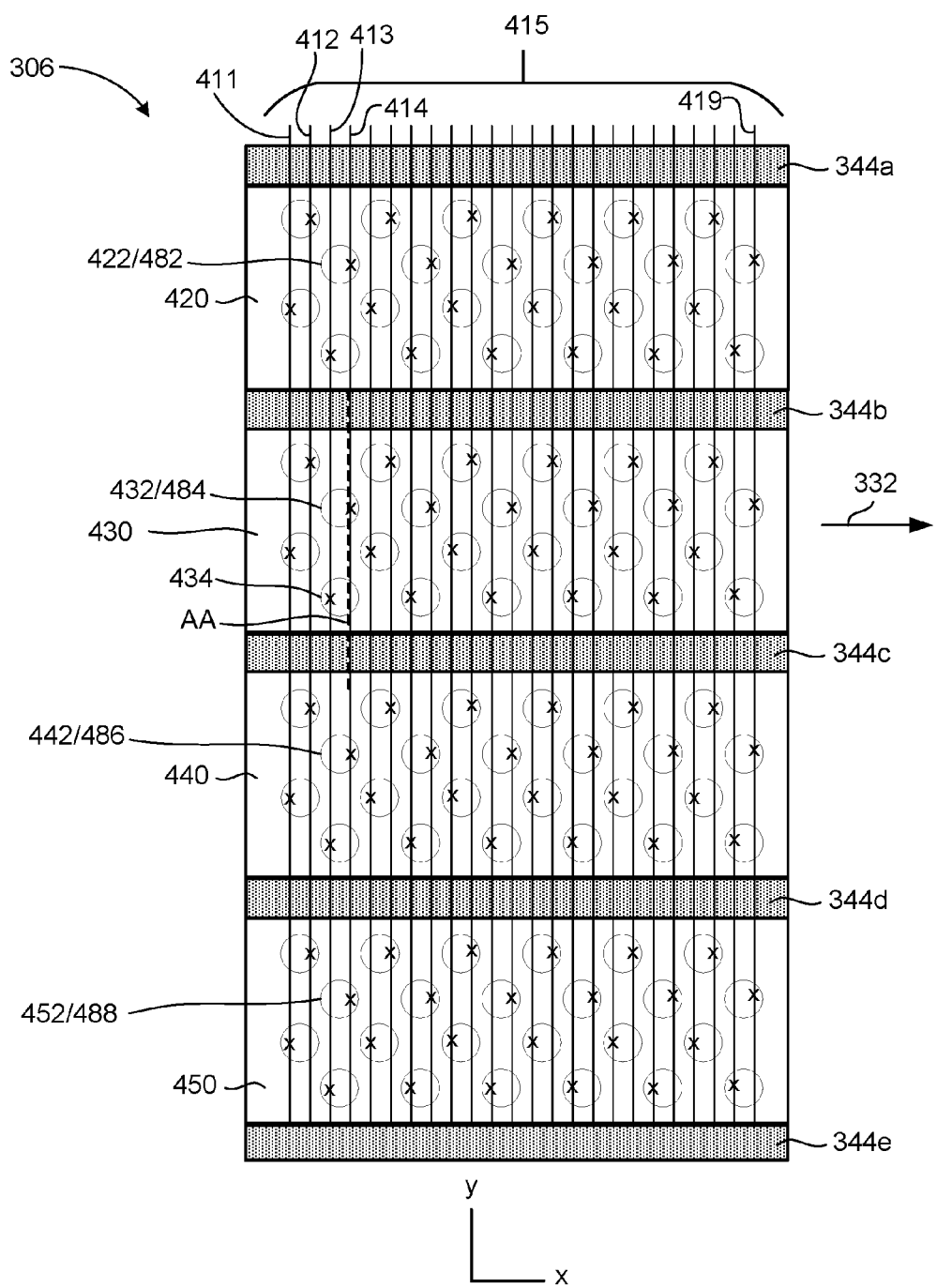
FIG. 4B depicts a plurality of circles that represent the vertical columns.

FIGS. 4B-4E depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local source lines 344a, 344b, 344c, 344d, 344e. Local source lines may also be referred to as "local interconnects". Local interconnects 344 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 4B also shows the vertical columns being staggered. In other embodiments, different patterns of staggering can be used. In some embodiments, the vertical columns are not staggered.

FIG. 4C depicts a portion of an embodiment of three dimensional memory structure 350 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; one source side select layer SGS; four dummy word line layers DWLL1a, DWLL1b, DWLL2a and DWLL2b; and forty eight data word line layers WLL0-WLL47 for connecting to data memory cells. Other embodiments can implement more or fewer than four drain side select layers, more than one source side select layer, more or fewer than four dummy word line layers, and more or fewer than forty eight word line layers (e.g., 96 word line layers). Vertical columns 432 and 434 are depicted protruding through the drain side select layers, source side select layer, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The source line (SL) is in direct electrical connection to local source lines 344b, 344c, in this embodiment. The NAND string of vertical column 432 has a source end at a bottom of the stack and a drain end at a top of the stack. As in agreement with FIG. 4B, FIG. 4C show vertical column 432 connected to Bit Line 414 via connector 423.

For ease of reference, drain side select layers SGD0, SGD1, SGD2 and SGD3; source side select layer SGS; dummy word line layers DWLL1a, DWLL1b, DWLL2a and DWLL2b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL57. For example, dielectric layers DL50 is above word line layer WLL46 and below word line layer WLL47. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1a, DWLL1b, DWLL2a and DWLL2b connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layer SGS is used to electrically connect and disconnect NAND strings from the source line SL.

Figure 4D:
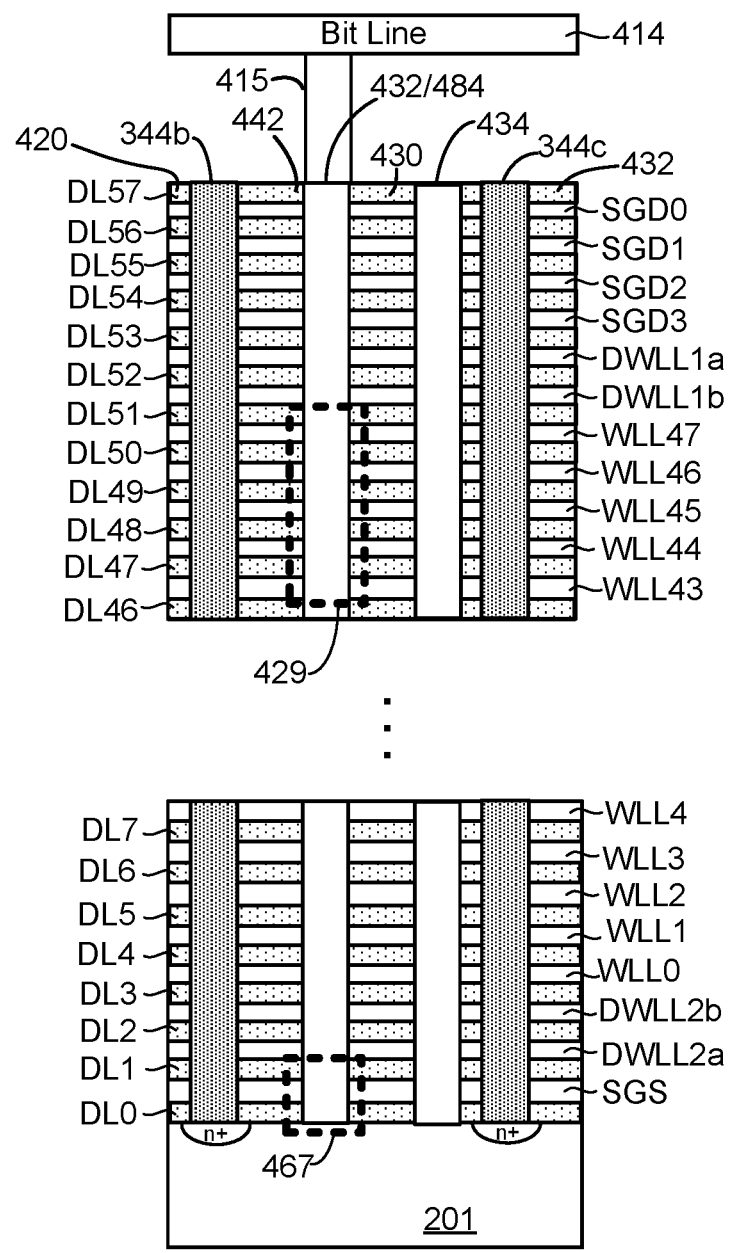
FIG. 4D depicts an alternative to the configuration of FIG. 4C.

FIG. 4D depicts an alternative to the configuration of FIG. 4C. There is not a source line (SL) running horizontally over the substrate 201 in FIG. 4D. Instead, the local source lines 344a, 344c are in direct electrical contact with the substrate 201. The substrate 201 has n+ regions at the contact point.

Figure 4E:
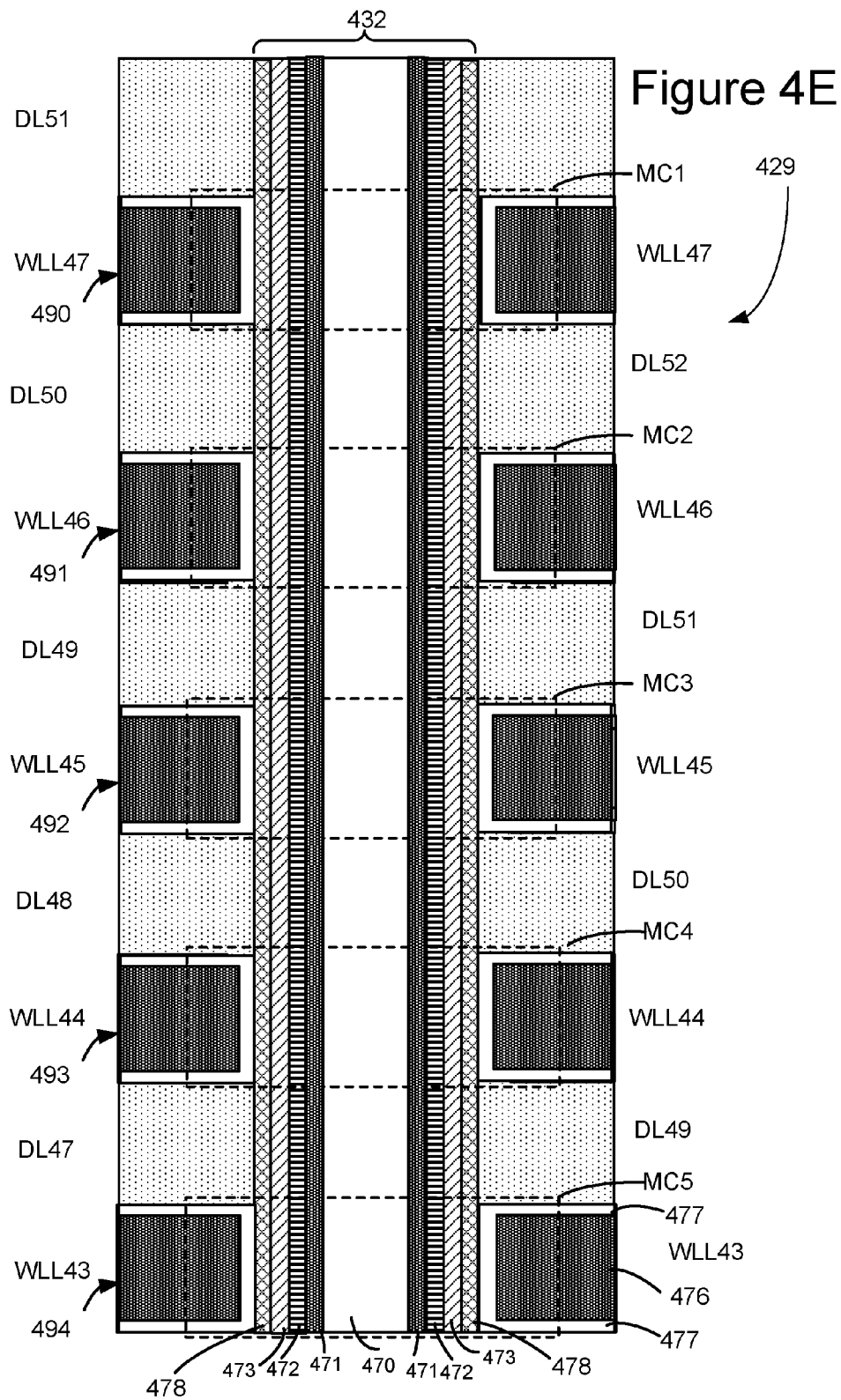
FIG. 4E depicts a cross sectional view of region 429 of FIG. 4C.

FIG. 4E depicts a cross sectional view of region 429 of FIG. 4C (as well as FIG. 4D) that includes a portion of vertical column 432. In one embodiment, the vertical columns are round and include four layers; however, in other embodiments more or fewer than four layers can be included and other shapes can be used. In one embodiment, vertical column 432 includes an inner core layer 470 that is made of a dielectric, such as $SiO_2$. Other materials can also be used. Surrounding inner core 470 is semiconductor channel 471. Semiconductor channel 471 is polysilicon, in one embodiment. Materials other than polysilicon can also be used. Note that it is the channel 471 that connects to the bit line. Surrounding semiconductor channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DL47, DL48, DL49, DL50, and DL51, as well as word line layers WLL43, WLL44, WLL45, WLL46, and WLL47. Each of the word line layers includes a word line region 476 surrounded by an aluminum oxide layer 477. The physical interaction of the word line layers with the vertical column forms the memory cells. Thus, a memory cell, in one embodiment, comprises channel 471, tunneling dielectric 472, charge trapping layer 473, silicon oxide layer (e.g., $SiO_2$) 478, aluminum oxide layer 477 and word line region 476. Together, the aluminum oxide layer 477 and the silicon oxide layer may be referred to as a blocking layer. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Although the example memory system discussed above is a three dimensional memory structure that includes vertical NAND strings with charge-trapping material, other (2D and 3D) memory structures can also be used with the technology described herein. For example, floating gate memories can also be used.

An alternative to the embodiment of FIG. 4E, is to form the aluminum oxide layer 477 entirely within the vertical column 432. Thus, aluminum oxide layer 477 could be formed roughly where silicon oxide layer 478 is depicted. Other layers 471, 472, 473, 478 can be moved inward.

Another alternative to the embodiment of FIG. 4E, is to form the silicon oxide layer 478 entirely outside the vertical column 432. Thus, silicon oxide layer 478 could be formed roughly where aluminum oxide layer 477 is depicted. In this case, aluminum oxide layer 477 can be formed between the silicon oxide layer 478 and word line layer.

Figure 5A:
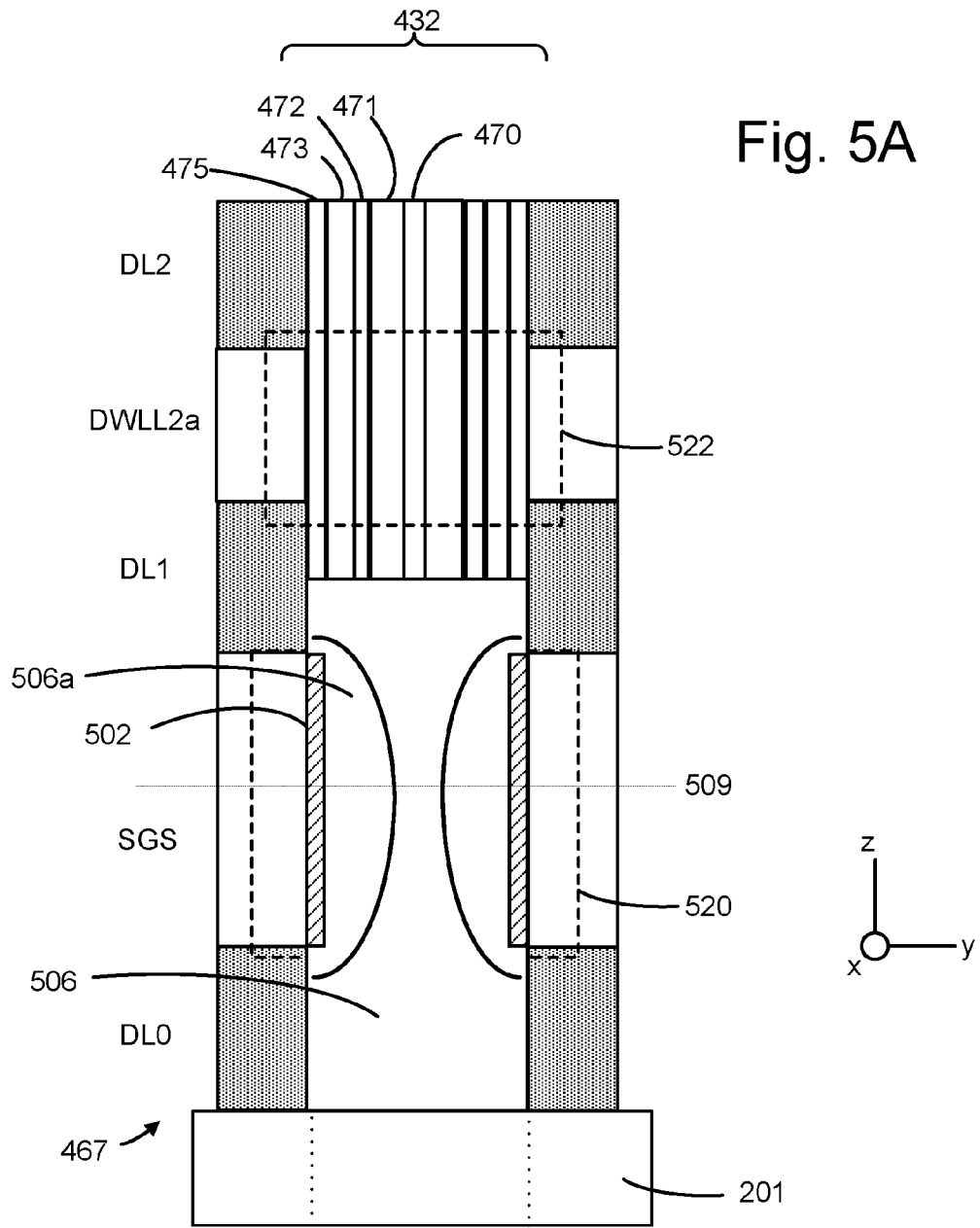
FIG. 5A depicts a close-up view of region 467 of FIG. 4D.
Figure 5B:
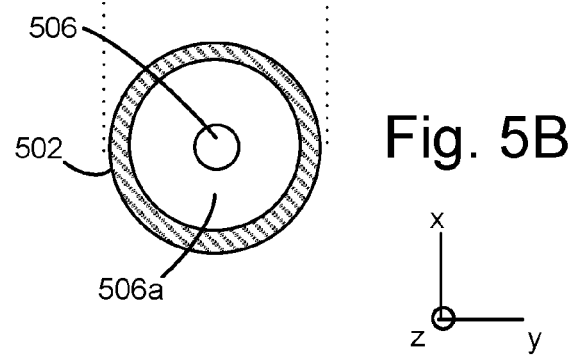
FIG. 5B depicts a cross-sectional view of the column 432 of FIG. 5A along line 509.

FIG. 5A depicts a close-up view of region 467 of FIG. 4D, which includes column 432 of FIG. 4D, showing a source-side select transistor 520 and a dummy memory cell 522. FIG. 5B depicts a cross-sectional view of the column 432 of FIG. 5A along line 509. The region 467 shows portions of the dielectric layers DL0 to DL2 and the conductive layers SGS and DWLL2a. In one embodiment, vertical column 432 includes an inner core layer 470 that is made of a dielectric, such as $SiO_2$. Other materials can also be used. Surrounding inner core 470 is semiconductor channel 471. Semiconductor channel 471 is polysilicon, in one embodiment. Surrounding semiconductor channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. Surrounding charge trapping layer 473 is blocking layer 475. Blocking layer 475 may comprise multiple layers, such as a layer of $SiO_2$ surrounded by a layer of $Al_2O_3$. Thus, note that FIG. 5A is an alternative to the configuration of FIG. 4E, in which the layer of $Al_2O_3$ 477 may be within the column 432.

The source-side select transistor 520 has a semiconductor body 506. The semiconductor body 506 is monocrystalline (e.g., monocrystalline silicon), in one embodiment. The semiconductor body 506 is polycrystalline (e.g., polycrystalline silicon), in one embodiment. The semiconductor body 506 could be formed from a semiconductor other than silicon. The semiconductor body 506 has a doped region 506a. The doping level may be used to establish a suitable Vt for the source-side select transistor. Additionally, the location of the doping may be precisely controlled, which helps to establish a suitable Vt for the source-side select transistor. The source-side select transistor SGS also has a gate dielectric 502. In one embodiment, the gate dielectric 502 is formed by oxidizing a portion of the semiconductor body 506. In one embodiment, the gate dielectric 502 is silicon oxide.

Figure 6A:
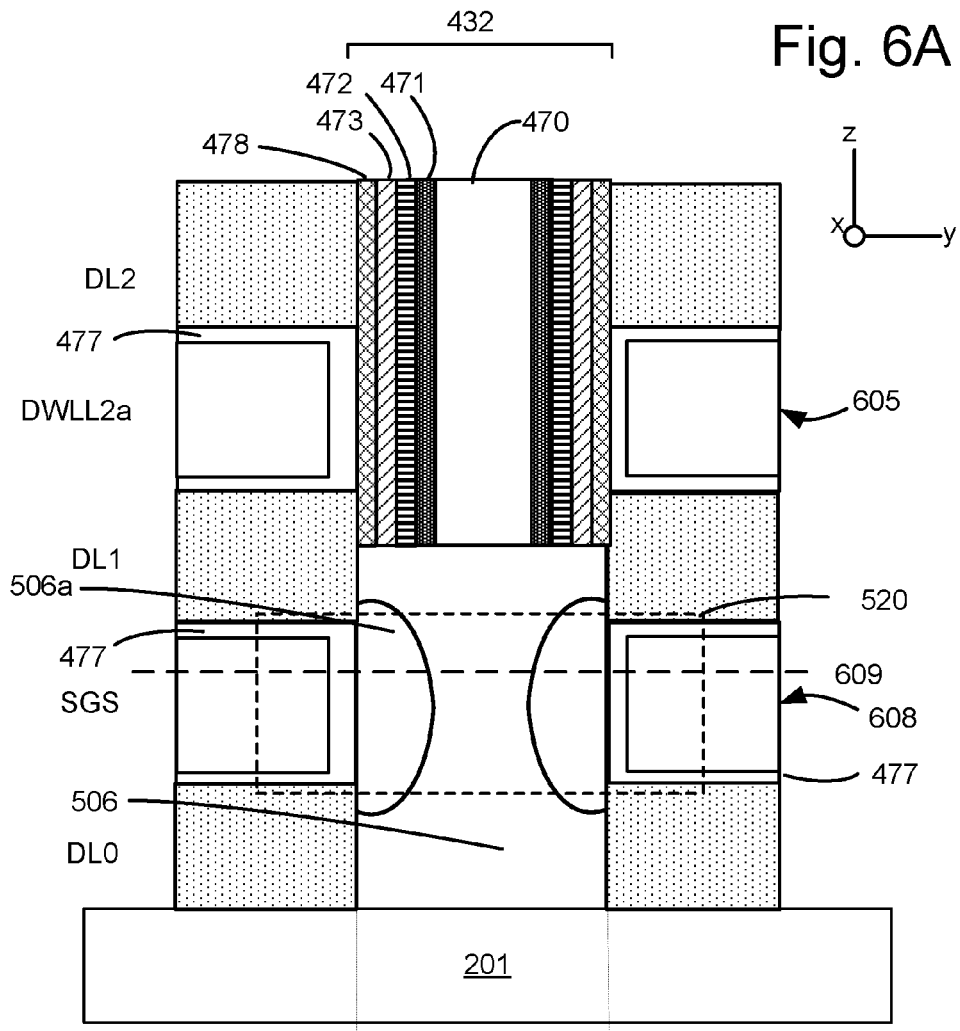
FIG. 6A depicts an alternative embodiment to that of FIGS. 5A-5B.
Figure 6B:
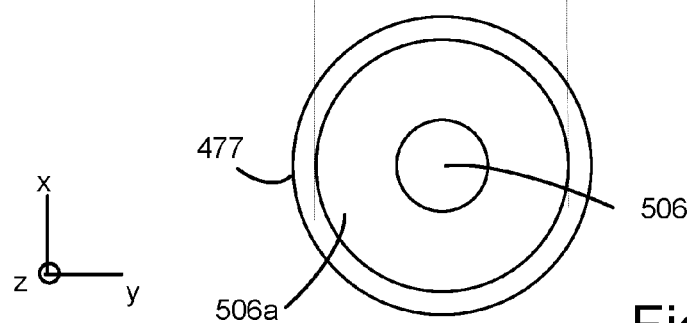
FIG. 6B shows a cross section of FIG. 6A along line 609.

FIGS. 6A and 6B depict an alternative embodiment to that of FIGS. 5A-5B. FIG. 6B shows a cross section of FIG. 6A along line 609. Note that in this embodiment, the column 432 has silicon oxide layer 478, tunnel dielectric layer 472, charge trapping layer 473, semiconductor channel 471, and core 470. However, in the embodiment of FIGS. 6A and 6B, the aluminum oxide layer 477 is located outside of the column 432. The aluminum oxide layer 477 has a portion that is in direct contact with silicon oxide layer 478. The aluminum oxide layer 477 has an optional portion above and below the word line 605. This optional portion results from one embodiment of the fabrication process in which after forming the column, sacrificial material is removed where the word line and aluminum oxide layer are to be formed. Then, the aluminum oxide layer 477 is deposited, followed by depositing the word line 605.

FIG. 6A shows similar layers DL0, SGS, DL1, DWLL2a, and DL2, as were depicted in FIG. 5A. The semiconductor body 506 of the source side select transistor 520 has a doped region 506a, which may be used to control the Vt of the source side select transistor 520. In one embodiment of FIGS. 6A-6B, the aluminum oxide layer 477 serves as at least a portion of the gate dielectric for the source side select transistor 520. Optionally, a portion of the semiconductor body 506 could be oxidized to form a portion of the gate dielectric. Conductive region 608 serves as a gate for the source side select transistor 520.

Figure 7:
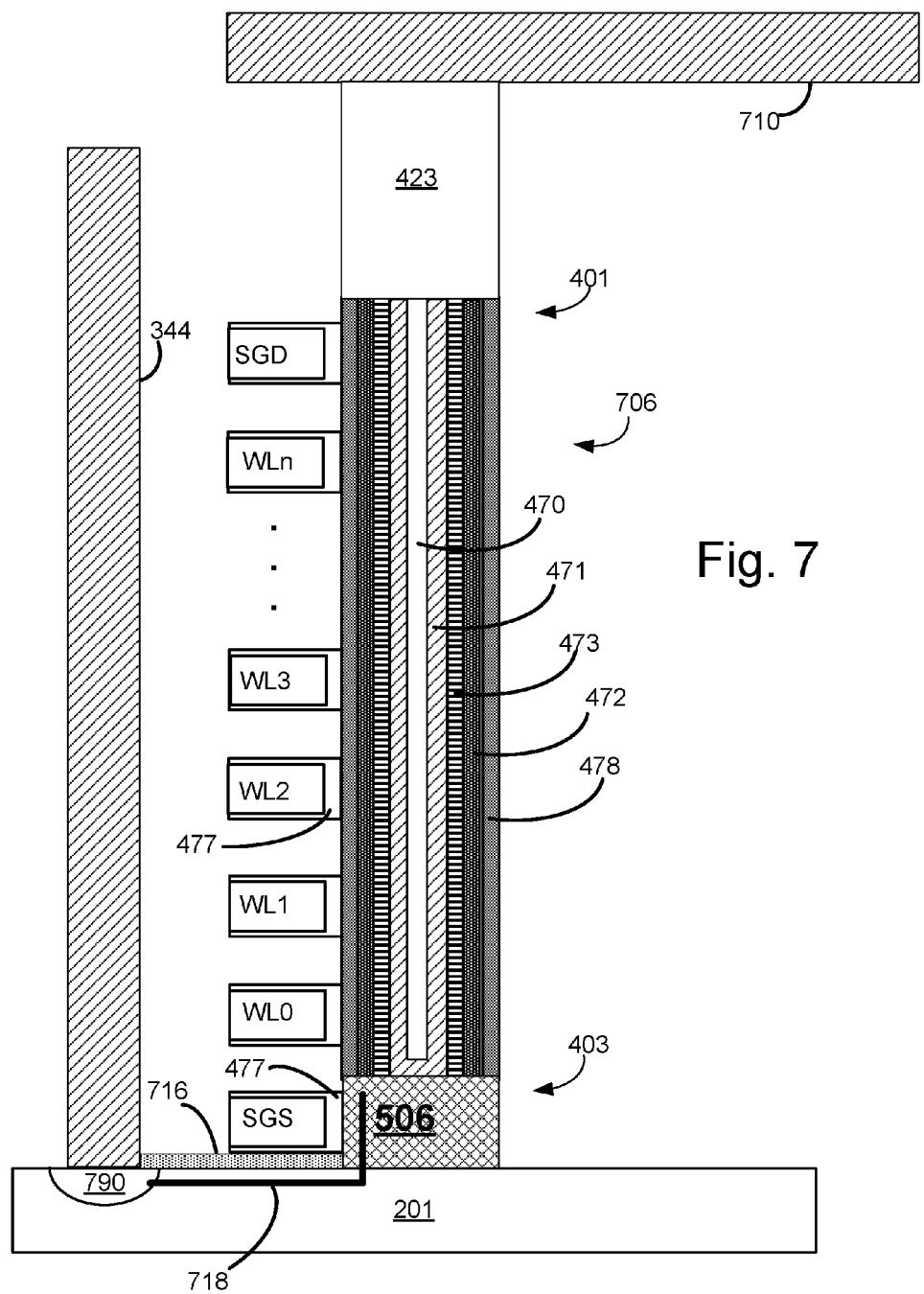
FIG. 7 shows electrical connections between of one embodiment the NAND strings and a bit line and a local source line.

FIG. 7 shows electrical connections between of one embodiment the NAND strings and a bit line 710 and a local source line 344. A single column 706 is depicted. The column 706 has silicon oxide region 478, charge storage region 473, tunnel dielectric 472, semiconductor channel 471, and core 470. On one side of the column 706, SGS, several word lines (WL0, WL1, WL2, WL3, . . . WLn), and SGD are depicted. Also, an aluminum oxide layer 477 is associated with each of SGS, WL0, WL1, WL2, WL3, . . . WLn, and SGD. Note that the word lines and blocking layer may completely surround the column 706. However, this is not depicted in FIG. 7 so as to not obscure the diagram. Also, the dielectric layers that alternate with the word line layers are not depicted in FIG. 7.

The bit line contact 712 is formed from metal, in one embodiment. Likewise, bit line 710 is formed from metal, in one embodiment. Example metals for the bit line and bit line contact include, but are not limited to, titanium, tungsten, copper, aluminum, and molybdenum.

FIG. 7 also depicts a source side select transistor. The SGS region, which may be formed from metal, serves as the control gate of the source side select transistor, in one embodiment. The portion of the aluminum oxide layer 477 that is between SGS and the semiconductor body 506 serves as a gate dielectric of the source side select transistor. The semiconductor body 506 of the source side select transistor is formed from crystalline silicon, in one embodiment. The source side select transistor semiconductor body 506 is in direct physical contact with the substrate 201, which may be formed from silicon. The portion of the substrate that is adjacent to the semiconductor body 506 may be p-type. The channel 718 of the source side select transistor has a vertical component in the column 706 and a horizontal component in the substrate 201. A gate oxide 716 is depicted on the surface of the substrate 201. This gate oxide 716 may serve as a portion of the gate oxide of the source side select transistor.

Source 790 may act as the source of the source side select transistor. The source 790 may be an n+ region. Thus, source 790 can be formed by heavily doping the silicon substrate 201. The n-type impurity can be phosphorous (P), arsenic (As) or a combination of both, for example.

The local source line 344 is in electrical contact with the source 790 of the source side select transistor. The local source line 344 is formed from metal, in one embodiment. Example metals include, but are not limited to, titanium, tungsten, copper, aluminum, and molybdenum. The local source line 344 can be electrically connected to the NAND string channel 471 by the action of the source side select transistor, when a respective bias is applied to the SGS line. Note that the local source line 344 may serve as a common source line for a number of NAND strings.

In some embodiments, there is a single SGS layer in which the source side select transistor is formed. Regardless of the number of SGS layers used to form the source side select transistor, the threshold voltage of the source side select transistor may be important for operation of the memory array. Embodiments disclosed herein accurately control the doping profile of the doped region 506a of the semiconductor body 506 of the source side select transistor. The doping profile 506a, in turn, may impact the threshold voltage. Thus, fabrication techniques disclosed herein allow precise control over the threshold voltage of a source side select transistor in a 3D memory array. Thus, memory array operations may be improved.

Figure 8:
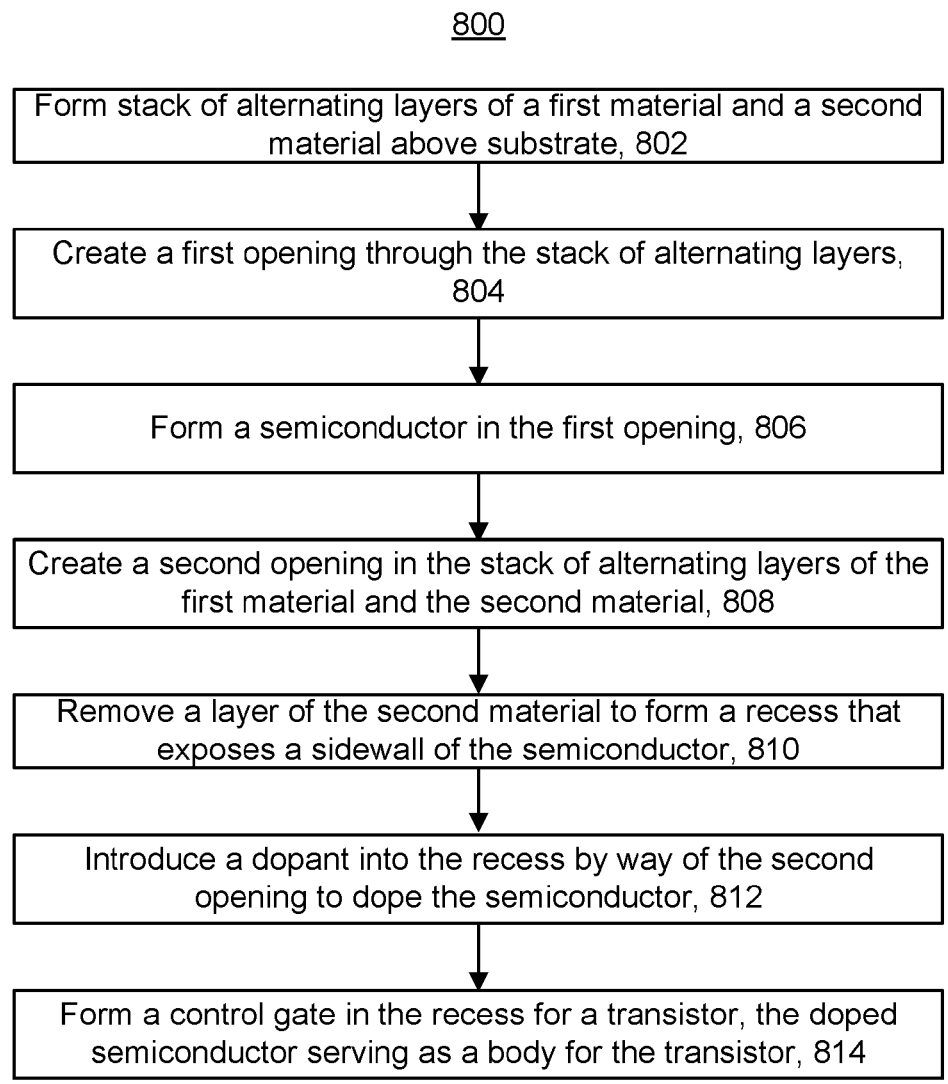
FIG. 8 is a flowchart of one embodiment of a process of fabricating a 3D memory array.

FIG. 8 is a flowchart of one embodiment of a process 800 of fabricating a 3D memory array. The process 800 may be used to fabricate devices such as, but not limited to, those depicted in FIGS. 3A, 4B-4E, 5A-5B, 6A-6B and 7.

Step 802 includes forming layers of material above a semiconductor substrate. In one embodiment, the semiconductor substrate is silicon. The semiconductor substrate may have a major plane that extends in a horizontal direction. The major plane may extend in the x/y-plane, as depicted in FIGS. 3, 4B-4E, 5A-5B, 6A-6B, for example. The layers of material may extend in the horizontal direction with respect to the major plane of the substrate.

The layers of material may include alternating layers of a first material and a second material. These two materials have an etch selectivity with respect to one another, in one embodiment. One material could be the dielectric of dielectric layers DL0-D57 in FIG. 4C or 4D. However, rather than depositing the conductive layers (e.g., SGS, DWLL2a, DWLL2b, WL0-WL47, DWLL1b, DWLL1a, SGD3-SGD0) a sacrificial material may be deposited instead. For example, silicon oxide could be deposited for dielectric layers DL0-D57, and silicon nitride for sacrificial layers.

Step 804 includes creating a first opening through the stack of alternating layers of the first and second material. This first opening may be referred to as a "memory hole", as it may be used to form memory cells therein. Note that many such memory holes can be formed in the stack of alternating layers. The first opening could correspond to any of the columns that are depicted in FIG. 4B-4E, 5A-5B, or 6A-6B. The first opening may extend vertically through the layers of the first and second materials down to the substrate 201, with respect to FIG. 4D, as one example. The first opening may extend vertically through the layers of the first and second materials down to the source line (e.g., SL), with respect to FIG. 4C, as one example.

Step 806 includes forming a semiconductor in the first opening. The semiconductor is formed at the bottom of the first opening, in one embodiment. The semiconductor may be silicon, but is not limited to silicon. The semiconductor may be monocrystalline, but is not required to be monocrystalline. In one embodiment, the semiconductor is polysilicon (note that the semiconductor could be amorphous, as deposited). Step 806 includes epitaxial growth of silicon, in one embodiment.

The semiconductor may be used for the semiconductor body 506 of the source side select transistor. Thus, step 806 may include forming material for semiconductor body 506, including what will become the doped region 506a (see, for example, FIGS. 5A, 5B, 6A, 6B). However, at this stage the final doping concentration in the doped region 506a has not yet been achieved. Some of the semiconductor that is formed in step 906 may be used to form the gate dielectric 502.

Step 808 includes creating a second opening in the stack of alternating layers of the first and second material. In one embodiment, the second opening is located where local source lines are to be formed (see, for example, local source lines 344 in FIG. 3, 4B, 4C, 4D). In one embodiment, the second opening has a long, narrow trench shape. Thus, the second opening may be used to form a local source line 344 that has a major plane in the x-z direction. Numerous such second openings can be formed in step 808.

Step 810 includes removing a layer of the second material to form a recess that exposes a sidewall of the semiconductor that was formed in step 806. The first material may be left in place. In one embodiment, the layer of second material is removed by introducing an etchant through the second opening. All of the layers of the second material could be removed in step 810.

Step 812 includes introducing a dopant into the recess by way of the second opening to dope the semiconductor. This dopant may be used to help establish a threshold voltage of a source side select transistor. In one embodiment, step 812 includes gas phase doping. In one embodiment, step 812 includes boron gas phase doping. In one embodiment, step 812 includes monolayer doping. An additional diffusion step may be performed with the monolayer doping. In one embodiment, step 812 includes a plasma doping process.

Step 814 includes forming a control gate in the recess for the source side select transistor. The doped semiconductor serves as a body for the source side select transistor.

Figure 9:
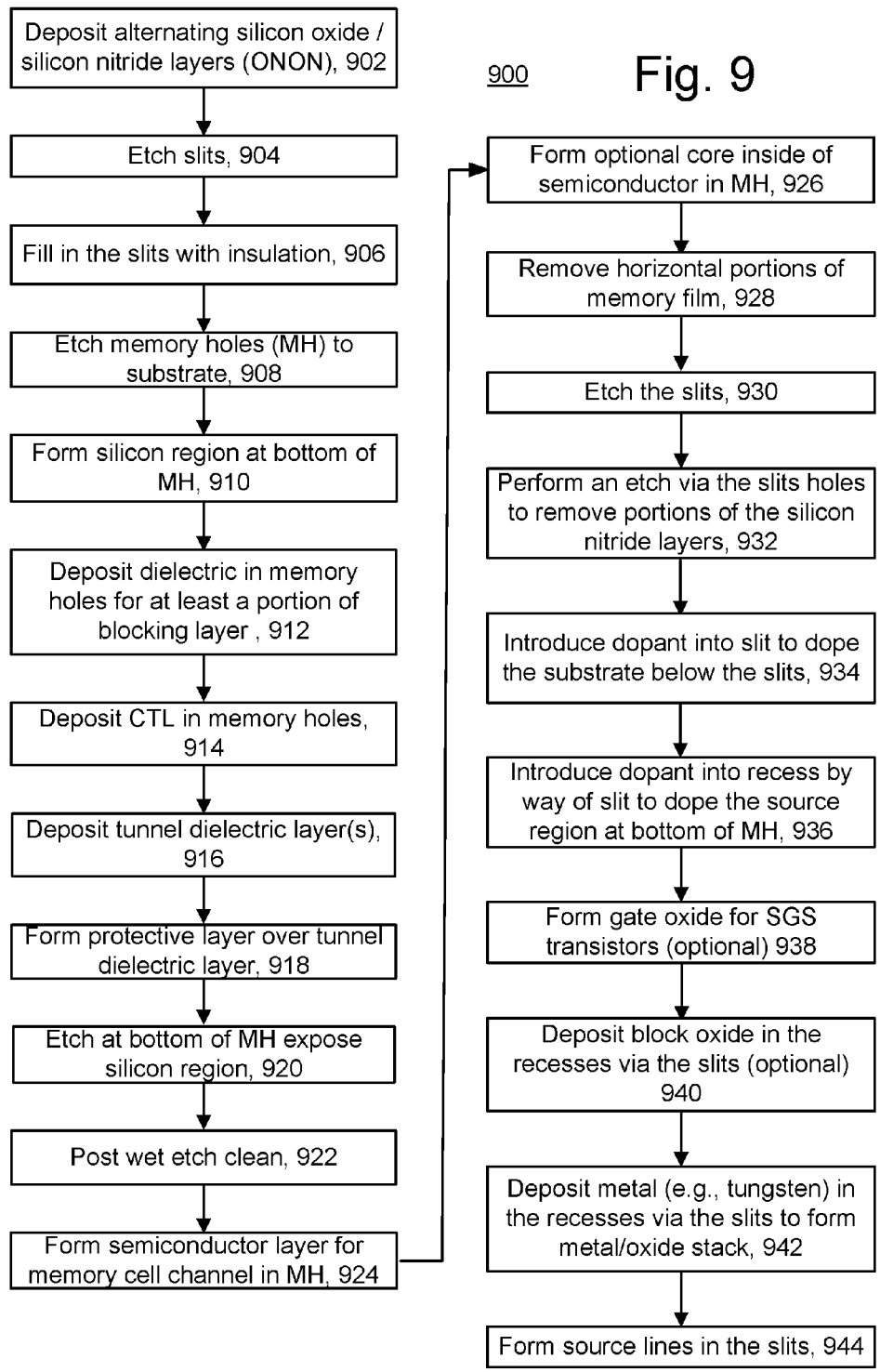
FIG. 9 is a flowchart of one embodiment of a process of forming NAND strings in a 3D memory array.

FIG. 9 is a flowchart of one embodiment of a process 900 of forming NAND strings in a 3D memory array. The process 900 provides further details of one embodiment of the process 800 of FIG. 8. FIGS. 10A-10J depict results after various steps of FIG. 9. FIGS. 10A-10J depict an example similar to the embodiment of FIG. 4D.

In FIG. 9, steps need not necessarily be performed as discrete steps in the order indicated. Various modifications can be made. Moreover, other steps which are known from the art of semiconductor fabrication but are not explicitly depicted here may also be performed. FIG. 9 represents a "word line last" technique in which the word lines are formed after forming the NAND strings. For example, after forming the NAND strings, sacrificial silicon nitride may be replaced, at least in part, with metal.

Prior to process 900, below-stack circuitry and metal layers may be formed in the substrate 201. Various circuits may be formed in the substrate 201. For example, a metal layer M0 can be used, e.g., for power line and global control signals, and a metal layer M1 can be used, e.g., for bit line and bus signals. In some cases, to make signal routing easier and to save area, a third metal (M2) can also be used, e.g., a total of three (or more) metal layers under the array. The metal layers can be fabricated from a patterned metal film. For example, aluminum can be used for the top metal layer, while the other layers are tungsten. Potentially, copper can be used instead of aluminum for upper layer, using a corresponding integration scheme. For silicidation, Ni, Ti, Co or W can be used, for instance. Note that it is not required to form circuits in the substrate 201. Also, at least some of the circuits can be formed over top of the array after process 900 is complete. For example, the aforementioned metal layers M0, M1 and optionally, M2 can be formed over the memory array.

Step 902 includes depositing alternating silicon oxide ($SiO_2$)/silicon nitride (SiN) layers above the substrate 201. The silicon nitride is a sacrificial layer, which will be replaced in part by material to form a portion of the blocking layer and in part by metal to form word lines (as well as a source select line (SGS), and a drain select line (SGD or SG). The silicon oxide will be used for the insulating layers between the metal word (and select) lines. Other insulators could be used instead of silicon oxide. Other sacrificial materials could be used instead of silicon nitride. Step 902 is one embodiment of step 802 from process 800 of FIG. 8, which is forming horizontal layers above a semiconductor substrate.

Step 904 includes etching slits in the alternating silicon oxide ($SiO_2$)/silicon nitride (SiN) layers. Step 906 includes filling in the slits with insulation. Note that later in process 900 at least a portion of this insulation will be removed. These slits may eventually be used as the second openings referred to in process 800. Thus, these slits can have a shape similar to the local source lines 344 depicted in FIG. 3. Note that such slits could extend for the entire length of a block.

Step 908 includes etching memory holes (MH) in the alternating layers of silicon nitride and silicon oxide. Reactive ion etching can be used to etch the memory holes. In the memory array area, the memory holes are placed densely. For example, the memory holes can have a diameter of 70-110 nanometers (nm) ($70\text{-}110 \times 10^{-9}$ meters). This is an example range; other ranges could be used. Also note that the diameter could vary from top to bottom. Step 908 is one embodiment of step 804 from process 800 of FIG. 8.

FIG. 10A shows results after one embodiment of step 908. FIG. 10A shows sacrificial layers (SAC0-SAC6 and SAC 56) alternating with insulating layers (DL0-DL7 and DL57) in a stack 1000 over a semiconductor substrate 201. As noted above, there may be more or fewer layers than in this example. Sacrificial layers SAC7 through SAC55 are not depicted in FIG. 10A. Insulating layers DL8 through DL56 are not depicted in FIG. 10A. FIG. 10A is consistent with formation of the device of FIG. 4D, which shows two memory holes 432, 434, and two source lines 344b, 344c. The two vertical memory holes (MH) in FIG. 10A correspond to memory holes 432, 434. In FIG. 10A, regions 1002a, 1002b are where insulation has been used to fill the slits. The source lines 344b, 344c will eventually be formed in regions 1002a, 1002b.

The sacrificial layers are silicon nitride (SiN) in this embodiment and will eventually be layers SGS, DWLL2a, DWWL2b, WLL0-WLL47, DWLL1b, DWWL2a, SGD3, SGD2, SGD1, and SGD0 (note that the aluminum oxide layer 477 may also be formed in the region vacated by the sacrificial layers in one embodiment). The insulating layers are silicon oxide in this embodiment. The two memory holes (MH) are depicted as extending vertically through the alternating sacrificial layers and insulating layers. The memory holes extend down to the semiconductor substrate 201, which is formed from silicon in one embodiment. Etching the memory holes could etch partway into the semiconductor substrate 201. An x-y-z coordinate system is depicted, showing the direction of formation. The memory holes each have a major axis that is parallel to the z-axis.

Figure 10B:
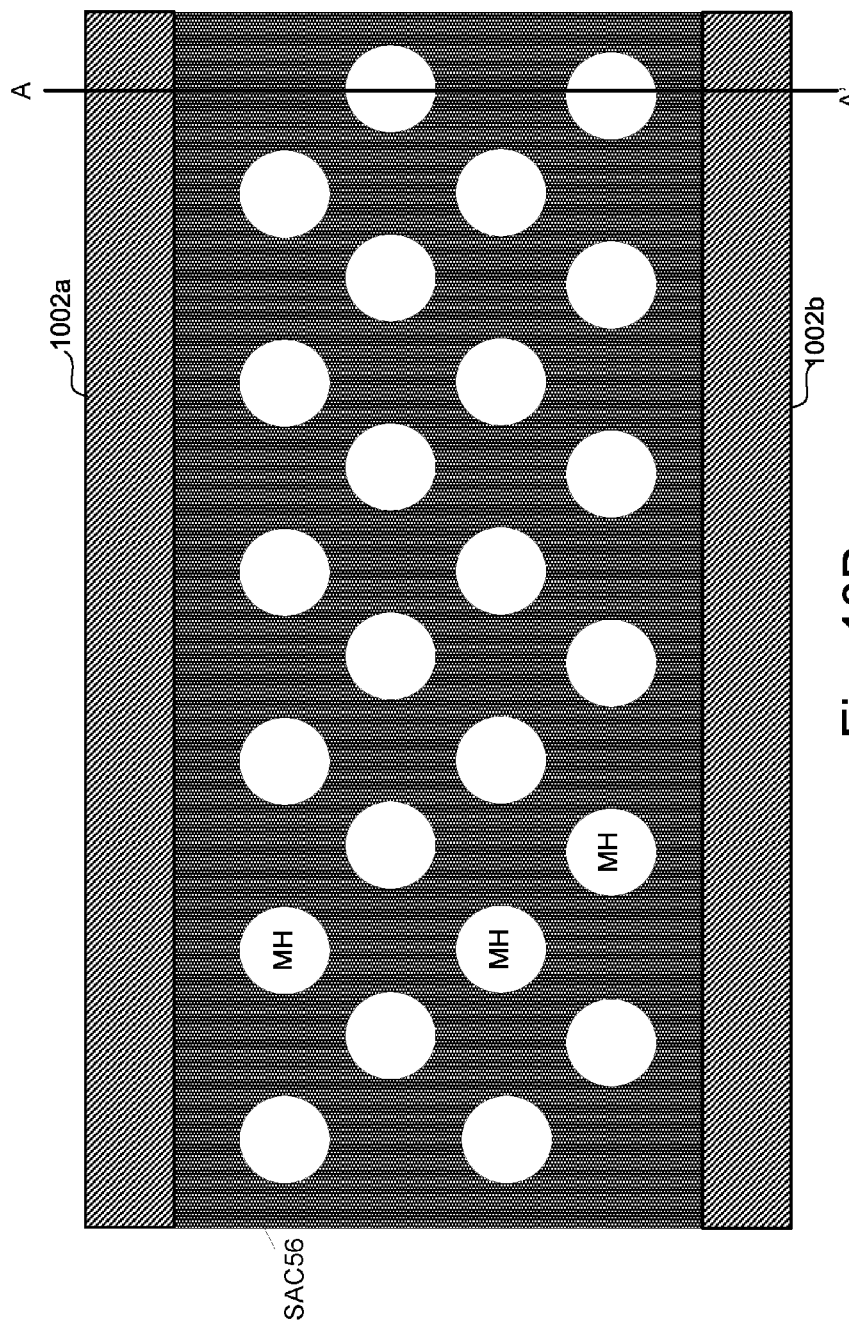

FIG. 10B shows a cross sectional view of sacrificial layer SAC56 from FIG. 10A after step 1008, showing one possible pattern for the memory holes (MH). This is not the only possible pattern. For example, the memory holes do not need to be staggered as depicted. An x-y-z coordinate system is depicted, showing the direction of formation. Note that line A-A' indicates that FIG. 10A is a cross section along line A-A' of FIG. 10B. Also note that the memory holes have a circular cross section in the horizontal direction (e.g., x-y plane), in this example. The memory holes are not required to be circular in cross section. Note that the memory holes could be of different diameter in the different layers. For example, the memory holes could have a smaller diameter at the lower layers. FIG. 10B shows that the insulation filled slits 1002a, 1002b extend in the x-direction.

Step 910 includes formation of silicon at the bottom of the memory holes for the source side select transistor bodies 506. In one embodiment, the silicon is mono-crystalline silicon. Step 910 includes epitaxial silicon growth at the bottom of the memory holes, in one embodiment. Step 910 is one embodiment of step 806 from process 800.

Figure 10C:
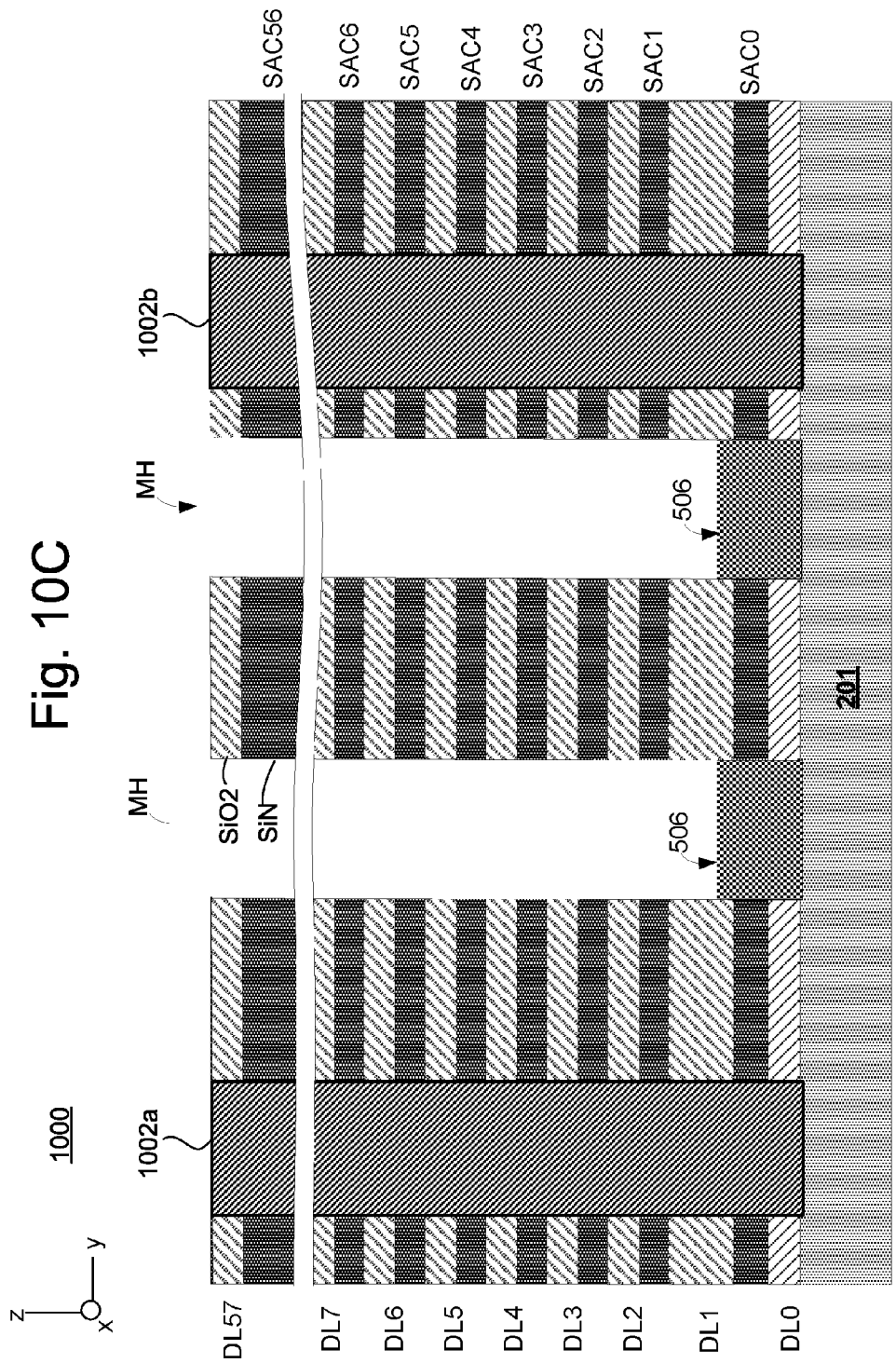

FIG. 10C depicts results after step 910, showing silicon region 506 in the bottom of the memory holes (MH). Note that silicon region 506 will serve as the body 506 of the source side select transistor. The silicon region 506 may cover the vertical sidewalls of the memory holes near the bottom (e.g., at DL0, sacrificial layer SAC0, and part of DL1). The silicon region 506 is in direct contact with the substrate 201, in the embodiment. In another embodiment, the silicon region 506 is in direct contact with a source line (SL) that is over the substrate 201 (there may be an insulator between the source line and substrate). FIG. 4C depicts one example having a source line (SL) over a substrate 201 (with insulator 454). Note that step 910 could form a semiconductor other than silicon for the bodies.

Step 912 is depositing a dielectric in the memory holes for at least a portion of the blocking layer. This may be deposited as a conformal layer over vertical sidewalls of the memory holes, as well as over the silicon region 506. In one embodiment, step 912 includes depositing a conformal layer of $SiO_2$ over vertical sidewalls of the memory holes. The $SiO_2$ may also cover the top of the silicon region 506.

Note that in some embodiments a portion of the blocking layer is formed outside of the memory holes. For example, referring back to FIG. 4E, an aluminum oxide layer 477 can be formed outside the memory holes. However, another option is to form aluminum oxide layer 477 within the memory holes, as in the example of FIG. 5A.

Step 914 is depositing the charge trapping layer (CTL) 473 in the memory holes. In one embodiment, a nitride such as SiN be deposited as a charge trapping layer 473. This may be deposited as a conformal layer over the blocking layer. The charge trapping layer 473 can be formed, for example, by chemical vapor deposition (CVD), atomic layer deposition (ALD), physical vapor deposition (PVD), or any suitable deposition technique.

Step 916 is depositing at least one of the layers of the tunnel dielectric 472 in the memory holes. The tunnel dielectric 472 may be deposited as a conformal layer on the charge trapping layer 473. Thus, the tunnel dielectric 472 may cover vertical sidewalls of the charge trapping layer 473, as well as the portion of the charge trapping layer 473 that is on the silicon region 506. The tunnel dielectric 472 can be formed, for example, by chemical vapor deposition (CVD), atomic layer deposition (ALD), physical vapor deposition (PVD), or any suitable deposition technique.

Step 916 may include depositing multiple layers, such as $SiO_2$ and SiON, with the $SiO_2$ nearest the charge trapping region (e.g., SiN). The tunnel dielectric might also include $SiO_2$ and ISSG (in-situ steam generation) formed oxide, with the $SiO_2$ nearest the charge trapping region. The tunnel dielectric might also include three layers: $SiO_2$, SiON, and ISSG formed oxide.

Step 918 is to deposit a protective layer over the tunnel dielectric layers. In one embodiment, a layer of silicon oxide is deposited. This may be deposited using CVD or ALD, as two examples. The silicon oxide may be about 5 nm in thickness. However, it could be thicker or thinner. The protective layer may serve to protect the tunnel dielectric during later etching steps.

Step 920 includes etching at the bottom of the memory holes to expose the silicon regions 506. In one embodiment, this is a reactive ion etch (RIE). Step 920 may include one or more anisotropic etch processes to sequentially etched various layers. The etch may include zero or more isotropic etch processes and zero or more anisotropic etch processes.

Step 922 is a post wet etch clean. This step removes of the protective layer (from step 918). In one embodiment, a wet etch is used to remove the silicon oxide protective layer. Also polymer residues from the etch of step 920 are etched away.

FIG. 10D shows results after step 922. The etching has created a gap in the memory file at the bottom of the memory holes to expose the top of silicon region 506. The etching has gone through the horizontal portion of tunnel dielectric layer(s) 472, through horizontal portion of the charge trapping layer 473, and through horizontal portion of the silicon oxide 478 at the bottom of the memory holes.

Step 924 is to form a semiconductor layer in the memory holes for the semiconductor channel of the memory cells. The semiconductor layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor layer includes amorphous silicon or polysilicon. The semiconductor layer can be formed by a conformal deposition method such as low pressure chemical vapor deposition (LPCVD). The thickness of the semiconductor layer can be in a range from 2 nm to 101 nm, although lesser and greater thicknesses can also be employed. The semiconductor layer may partially fill the cavity in each memory opening, or may fully fill the cavity in each memory opening.

Step 926 is an optional step of forming a dielectric core inside of the semiconductor channel. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

Certain of the steps of process 900 form a memory cell film in the memory holes. For example, steps 912, 914, 916, and 924 are one embodiment of forming a memory cell film in memory holes.

Figure 10E:
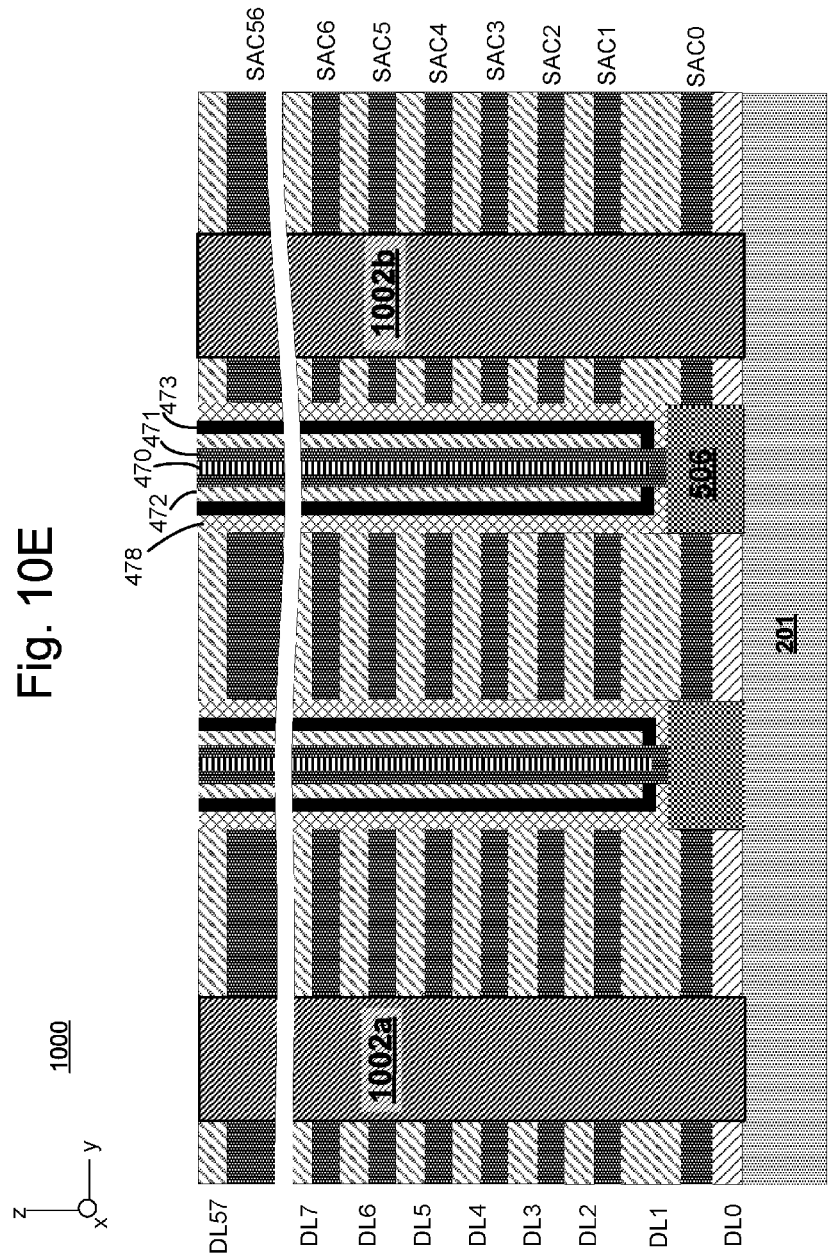

Step 928 is to remove a portion of the memory film outside of the memory holes. The horizontal portion of various layers can be removed, for example, by a recess etch or a chemical mechanical planarization (CMP). Optionally, an n-type dopant can be implanted in the drain end of the semiconductor channel. This creates an n+ region at the drain end that reduces contact resistance with a bit line contact, in one embodiment. FIG. 10E depicts results after step 928. FIG. 10E shows the addition of the semiconductor channel 471 and optional core dielectric in the memory holes.

Step 930 is to etch the slits 1002. This removes the material that was in the slits and is done to allow removal of the sacrificial silicon nitride and to deposit metal. Step 930 is one embodiment of step 808 from process 800.

Step 932 includes performing an etch via the slits to remove portions of the silicon nitride layers. The etch can involve introducing an etchant via the slits, which has a higher selectivity for the silicon nitride, removing the silicon nitride layers. The wet etch is not relatively highly selective of the silicon oxide so that the silicon oxide is not substantially removed. The etch may have a relatively higher selectivity (e.g., by a factor of 1000, or more generally, 100 or more) for the silicon nitride relative than for the silicon oxide. Also note that the etch should not remove the NAND strings. Step 932 is one embodiment of step 810 from process 800.

The wet etch should remove essentially the entire silicon nitride layers wherein the NAND strings are being formed (memory cell area), so that when the regions of the removed silicon nitride are replaced in at least part by metal, the metal will extend in substantially the entire layer in the memory cell area. Thus, word line layers at different levels should be isolated from one another and not shorted together. This applies regardless of the etch method, e.g., whether the etchant is introduced via the slits, memory holes, other holes or voids, or combinations thereof. The NAND strings in the memory holes serve as anchors which support the silicon oxide layers when the silicon nitride is removed by etching through slits.

A variety of etching techniques may be used to etch the silicon nitride. Nitride can be etched in one embodiment, by heated or hot phosphoric acid ($H_3PO_4$). As an example, the boiling point of phosphoric acid varies with the concentration of the acid. For example, for a range of acid concentration between 79.5%-94.5% the boiling point may vary from 140° C.-200° C. The etch rate of silicon nitride varies with the temperature and the concentration of the acid. Since the bath is operated at high temperature, water readily evaporates from the solution and the concentration of phosphoric acid changes. Therefore, this may be considered to be a type of "wet" etch. However, a wet etch is not necessarily needed for nitride, as other etching techniques may be applied. In other embodiments, the sacrificial material in the stack may be something other than silicon nitride. Therefore a different type of etch process and etchant may be used.

FIG. 10F depicts results after one embodiment of step 932. FIG. 10F shows that the insulation has been removed from the slits. Also, the silicon nitride in the sacrificial layers has been removed leaving horizontal recesses where the sacrificial layers previously were. The material in the memory holes may serve as an anchor to hold the dielectric layers in place. What were sacrificial layers (SAC0-SAC56) are now labeled recess layers (REC0-REC56).

In step 934, an impurity is introduced into the slits to dope the substrate below the slits. An example impurity for the n+ region is Arsenic. An example doping concentration for the n+ region is $1 \times 10^{20}/cm^3$.

In step 936, an impurity is introduced into a recess via the slits to dope the semiconductor region 506 at the bottom of the memory holes. The recess may be REC0. An example impurity for doping the semiconductor region 506 region is Boron. In one embodiment, the impurity for doping the semiconductor region 506 region is Aluminum. In one embodiment, impurity for doping the semiconductor region 506 region is Gallium. An example doping concentration for the n+ region is $1 \times 10^{18}/cm^3$. Prior to introducing the impurity in step 936, a cleaning step may be performed to obtain a clean, oxide free surface for the semiconductor (e.g., silicon) region 506. A thermal anneal may be performed to diffuse the dopant in the semiconductor region 506. The thermal anneal could be performed as part of step 936, or later in process 900. Step 936 is one embodiment of step 812 from process 800.

In one embodiment, step 936 includes gas phase doping. In one embodiment, step 936 includes boron gas phase doping. Examples of dopant sources for boron gas phase doping include, but are not limited to, $BBr_3$, $BCl_3$, and $B_2H_6$. In one embodiment, step 936 includes aluminum gas phase doping. In one embodiment, step 936 includes gallium gas phase doping.

In one embodiment, step 936 includes monolayer doping. In monolayer doping, a monolayer of a dopant may be assembled on the exposed sidewall of the silicon body 506. A subsequent thermal treatment may be used to break down dopant molecules, resulting in a thermal diffusions of dopant atoms into the silicon body 506. The thermal treatment time and temperature may be used to control the doping profile of the doped region 506a. The impurity for doping the semiconductor region 506 is boron, in one embodiment of monolayer doping. However, another impurity could be used for monolayer doping of the semiconductor region 506.

In one embodiment, step 936 includes a plasma doping (PLAD) process. As one example, the dopant in the PLAD process can be boron. In one embodiment, the dopant source for PLAD is $BF_3$. In one embodiment, the dopant source for PLAD is $B_2H_6$. Other dopant sources could be used for boron doping in a PLAD process. Other dopants could be used in a PLAD process.

Figure 10G:
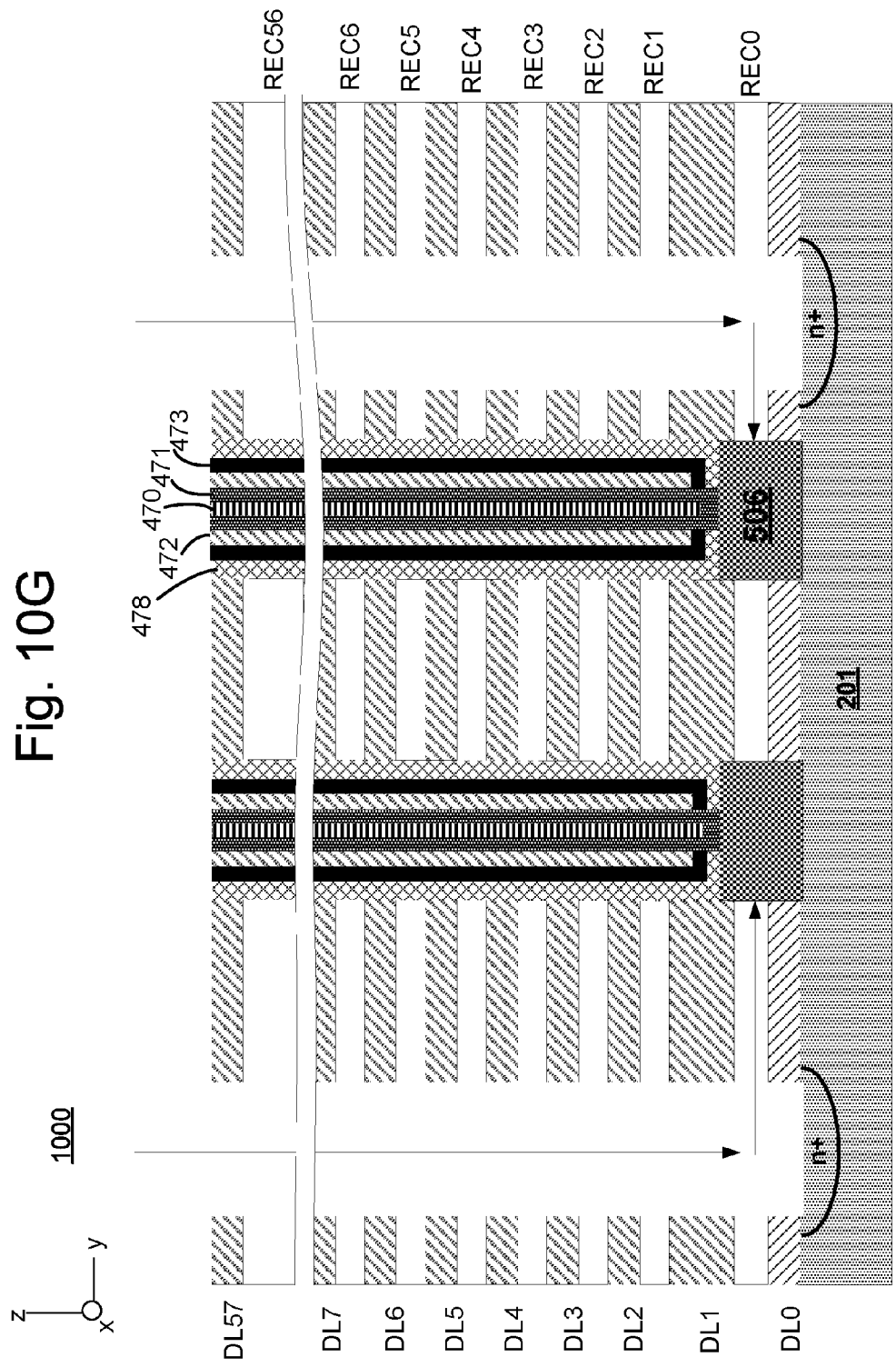
Figure 10H:
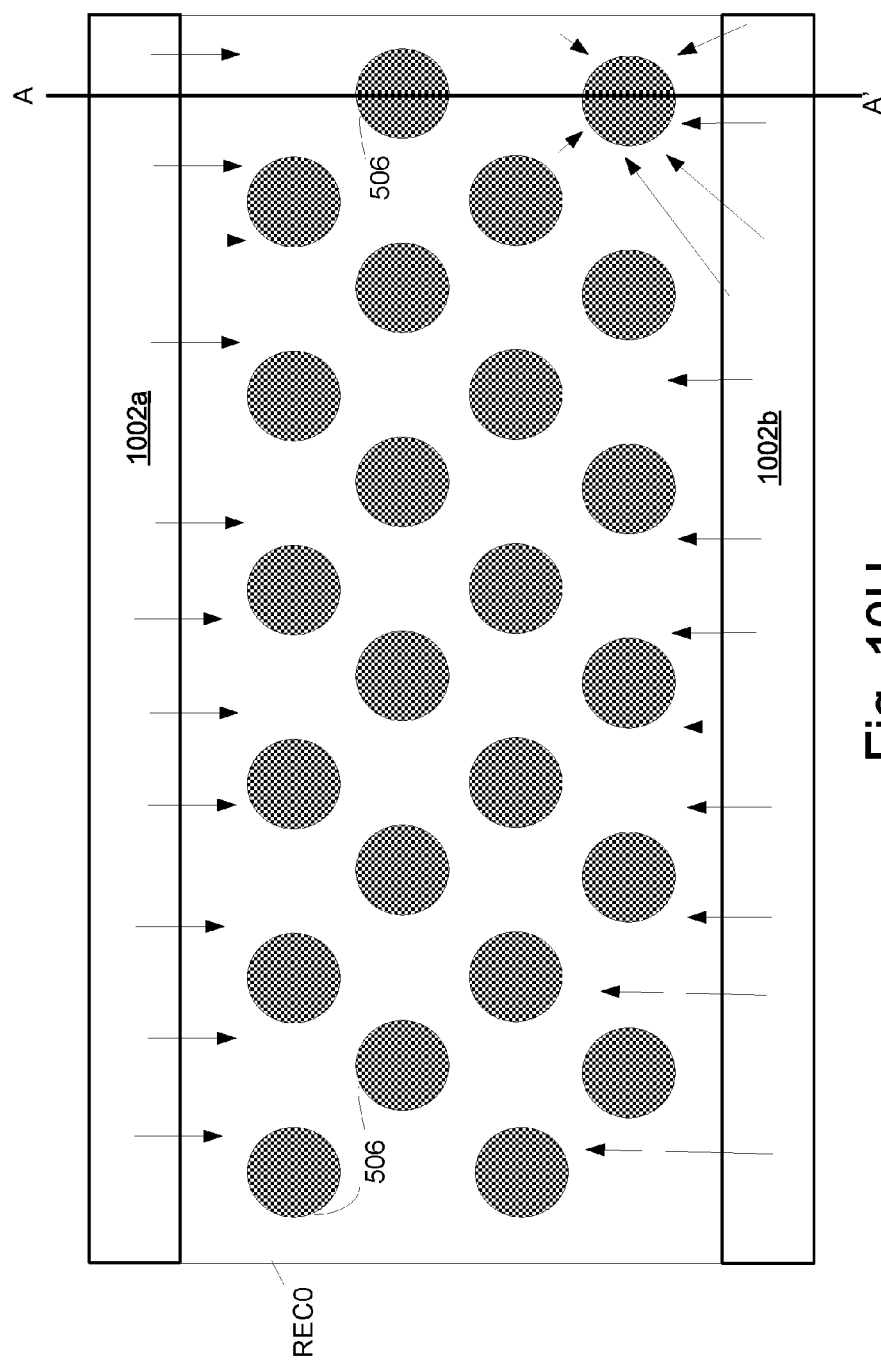

FIGS. 10G-10H depict introducing the impurity of step 936. FIG. 10H is a cross sectional view at recess layer REC0. FIG. 10G shows that the substrate 201 below the slits has been doped with an n type impurity (e.g., n+ region). The arrows in the z-direction in FIG. 10G represent introducing the impurity into the slits. This impurity travels through the recess at the recess layer REC0 to dope the exposed sidewalls of the semiconductor region 506 at the bottom of the memory holes. The arrows in the y-direction in FIG. 10G and in the x-y plane in FIG. 10H represent the impurity traveling through the recess at recess layer REC0. Thus, the semiconductor body 506 may be doped by introducing a dopant into recess layer REC0 by way of the slits.

In some embodiments, the impurity for the n+ region and the impurity for doping the semiconductor region 506 are of the opposite type of conductivity. For example, the impurity for the n+ region may be an n-type donor and the impurity for doping the semiconductor region 506 may be a p-type donor. In one embodiment, some of the p-type donor that is introduced into the recess via the slits to dope the semiconductor region 506 could also end up in the region of the substrate 201 below the slits (e.g., the n+ region). The concentration of the n-type donor in the n+ region is substantially greater than the concentration of the p-type donor in n+ region, such that the net doping concentration is n+, in one embodiment.

Note that the blocking layer (e.g., silicon oxide 478, or aluminum oxide, if used) in the memory hole may serve as protection for other layers in the memory hole during the doping of the semiconductor body 506.

Figure 10I:
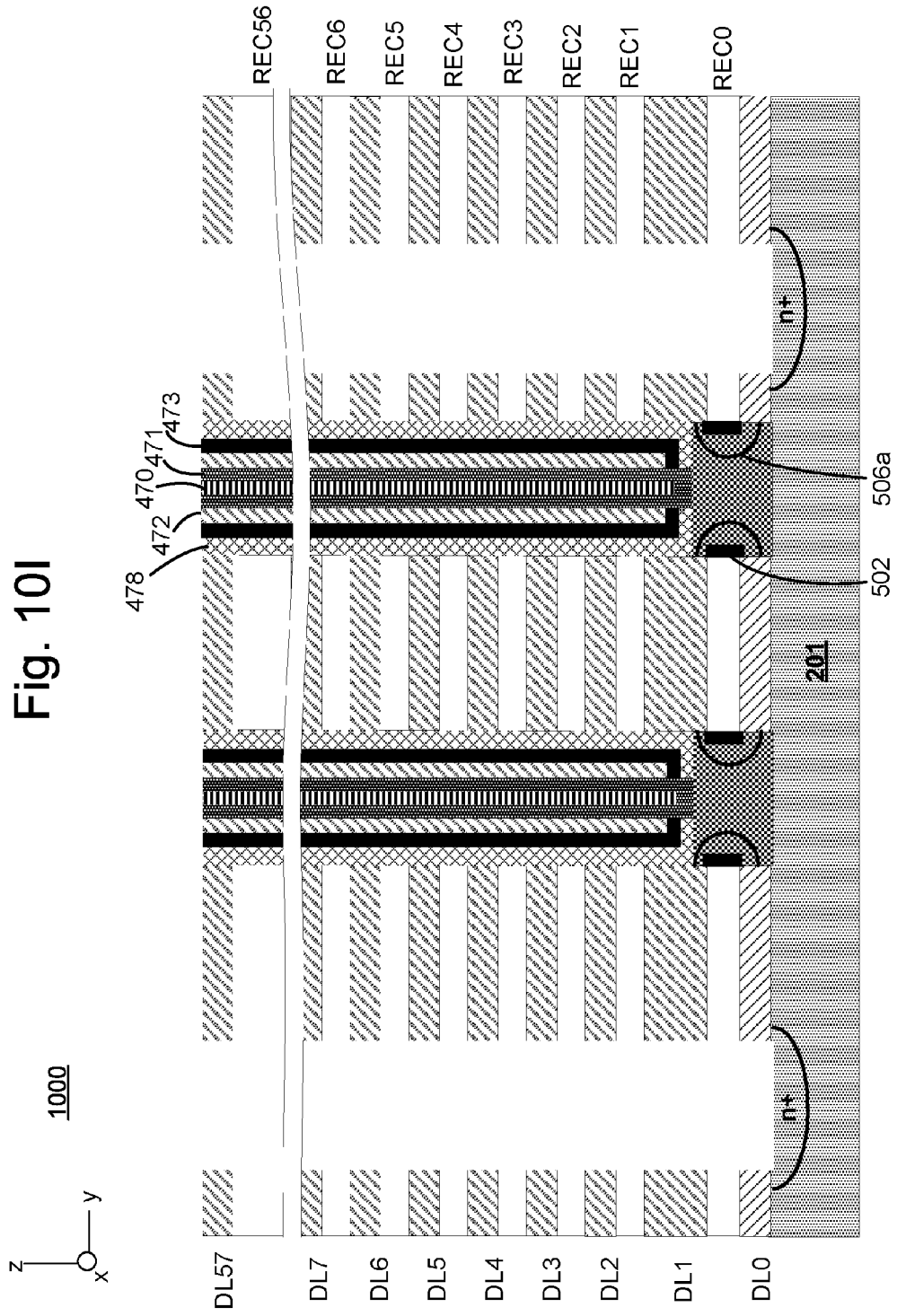

Step 938 is an optional step of forming a gate oxide for the source side select transistors. Step 938 may include oxidation of sidewalls of the semiconductor region 506 to form gate oxides. FIG. 10I depicted results after one embodiment of step 938. The gate oxide regions 502 are depicted on sidewalls of the semiconductor region 506. Also, the region of the semiconductor region 506 that was doped in step 936 is shown as region 506a.

Step 938 may include converting a surface portions of the semiconductor region 506 into a semiconductor oxide portion, a semiconductor nitride portion, or a semiconductor oxynitride portion by oxidation, nitridation, or a combination of oxidation and nitridation, of the physically exposed portions of the semiconductor region 506. The gate oxide 502 may laterally surround a respective semiconductor region 506.

In optional step 940, a portion of the blocking layer is formed in the recesses. This portion of the blocking layer is an $Al_2O_3$ layer, in one embodiment. This portion of blocking layer may be deposited by ALD from outside of the memory hole through the slits.

Step 942 includes depositing metal (e.g., one or more layers) in the recesses via the slits. In one embodiment, the metal is tungsten. This forms a metal/oxide stack. Metal is provided in the slits to fill the recesses left when the sacrificial material was removed. Chemical vapor deposition (CVD) or atomic layer deposition (ALD) could be used to deposit the metal. Step 942 is one embodiment of step 814 from process 800.

Step 944 is forming material in the slits for the local source lines (also referred to as local interconnects). Step 944 may include depositing an insulating layer in the slits to cover vertical sidewalls of the slits. Initially, the insulating layer may also cover the substrate at the bottom of the slits. The insulating layer in a slit may be etched to create an opening for the source line. The substrate 201 is exposed as a result of etching the insulating layer, in one embodiment.

Step 944 may include depositing one or more conductive fill materials in the slits. The conductive fill materials serve as the source lines. For example, a first conductive fill material can include a doped semiconductor material such as doped polysilicon. The first conductive fill material might be used in the lower portion of the slits. A second conductive fill material can include at least one metallic material such as a combination of a conductive metallic nitride material (such as TiN) and a metal (such as W, Co, or Ru). Step 944 may also include one or more etching steps to remove excess fill material (for both the first and second fill material).

Figure 10J:
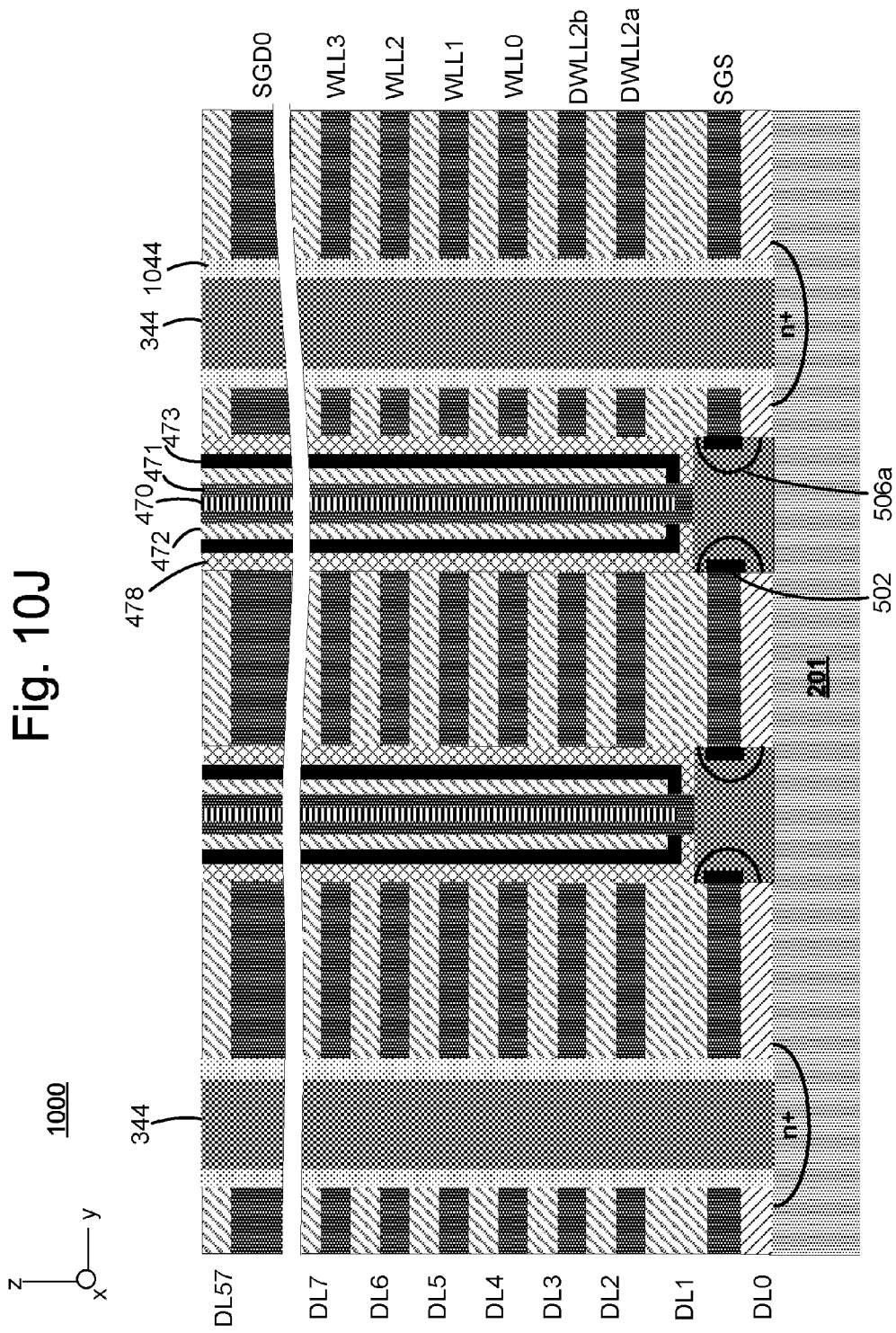

FIG. 10J depicts results after one embodiment of step 944. The recesses in the stack have been filled with a conductive material. Thus, the recess layers are re-labeled as SGS, DWLL2*a*, DWLL2*b*, WLL0, WLL1, WLL2, WLL3, and SGD0. As the aluminum oxide layer was described as being optional, it is not depicted in FIG. 10J. However, in one embodiment, there is an aluminum oxide layer 477 outside of the memory holes, as in FIG. 4C.

The source lines 344 are now formed in the slits. An insulating layer 1044 provides electrical insulation between the source lines 344 and the conductive layers (SGS, DWLL2*a*, DWLL2*b*, WLL0, WLL1, WLL2, WLL3, and SGD0).

After step 944, additional steps may be performed to form bit line contacts, source line contacts, bit lines, global source lines, etc.

In the process of FIG. 10, the body of the source side select transistor is formed from silicon. In another embodiment, the body of the source side select transistor is formed from a III-V compound.

As is apparent from the description of the embodiments disclosed herein, fabrication techniques are disclosed for precisely controlling the doping profile of the semiconductor body 506 of the source side select transistor in a 3D memory array. The source side select transistor may be for a vertical NAND string. Precisely controlling the doping profile may achieve a precise threshold voltage.

Note that were the semiconductor body 506 to be doped by introducing an impurity into the memory holes, there is a significant risk that the doping profile would not be precisely controlled. Consider a hypothetical in which an impurity is introduced into the memory hole at the stage of fabrication depicted in FIG. 10C. First note that the height of the semiconductor region 506 is subject to vary somewhat. The height could vary from memory hole to memory hole in the same block, between different blocks, between different memory die, etc. For the sake of illustration, an impurity could be introduced with the intention of generating a doping profile with heavy concentration somewhat below the horizontal surface of the semiconductor region 506, such that the doping concentration is heaviest near the gate region (e.g., a SAC0). One such technique is to perform a high energy implant. However, if the top of the semiconductor region 506 is higher than expected, then the doping concentration may physically be too high in the stack. Significantly, the highest doping concentration may be closer to SAC1 than desired. This could lead to read disturb. On the other hand, if the top of the semiconductor region 506 is lower than expected, then the highest doping concentration may physically be too low in the stack. In such a case, the heaviest doping concentration might be below the gate of the SGS transistor. For example, the heaviest doping concentration might be close to the DL0 layer. In either case, the doping concentration in semiconductor region 506 at the level of SAC0 (where the gate will be formed) may be lower than desired. In either case, the threshold voltage of the SGS transistor may fail to meet a target specification.

Another possible technique for doping the semiconductor region 506 is to add an impurity while the semiconductor region 506 is being formed in the memory hole. For example, an impurity might be added during epitaxial growth of silicon in the memory hole. However, this suffers from similar problems as the performing a high energy implant. That is, the doping profile might fail to meet a target profile, depending on factors such as the epitaxial growth rate.

Embodiments disclosed herein are not sensitive to the height of the semiconductor region 506 or growth rate of the semiconductor region 506 in the memory hole. Embodiments disclosed herein are able to precisely deliver the heaviest doping concentration near the gate region of the SGS transistor. Moreover, the doping concentration will naturally fall off in the z-direction (see, for example, FIGS. 5A, 6A). This may be referred to as a "graded profile. A graded profile may be especially important above the gate of the SGS transistor. Referring to FIGS. 5A, 6A, the doping concentration falls off quickly at the DL1 level. This can help to reduce or prevent data disturb on memory cells at the lower word line layers. The graded profile in one embodiment is concentrated in the semiconductor body 506*a* near the SGS level and has a gradually lower concentration moving upwards from the SGS level.

One embodiment disclosed herein includes a method of fabricating non-volatile storage comprising the following. A stack of alternating layers of a first material and a second material are formed over a substrate. The material has an etch selectively with respect to the second material. A first opening is created through the stack of alternating layers. A semiconductor is formed in the first opening. A second opening is formed in the stack of alternating layers of the first material and the second material. A layer of the second material is formed to form a recess that exposes a sidewall of the semiconductor. A dopant is introduced into the second opening and into the recess to dope the semiconductor. A control gate for a transistor is formed in the recess. The doped semiconductor serves as a body for the transistor.

One embodiment disclosed herein includes a method of fabricating three-dimensional NAND, comprising the following. A stack of alternating horizontal layers of a first material and a second material is formed over a substrate. The first material has an etch selectively with respect to the second material. A vertical memory hole is etched through the stack of alternating horizontal layers. The vertical memory hole has a vertical sidewall. Silicon is formed for a body of a source side select transistor for a NAND string in the vertical memory hole. The silicon covers the vertical sidewall of the memory hole near the substrate. A memory cell film is formed on the vertical sidewall of the memory hole above the silicon for the body. The memory cell film is for memory cells of the NAND string. A vertical opening is etched in the stack of alternating horizontal layers. The horizontal layers of the second material are etched away to form horizontal recesses in the stack. A first of the horizontal recesses exposes the silicon for the body of the source side select transistor. A dopant is introduced into the first horizontal recess by way of the vertical opening to dope the body of the source side select transistor. A conductive material is formed in the horizontal recesses. The conductive material serves as control gates of the memory cells of the NAND string and as a control gate of the source side select transistor of the NAND string.

One embodiment includes a method of fabricating non-volatile storage. The method comprises: forming a stack of alternating layers of silicon oxide and silicon nitride over a substrate; etching a plurality of memory holes through the alternating layers of silicon oxide and silicon nitride, the memory holes each having a vertical sidewall; growing crystalline silicon in the plurality of memory holes upwards from the substrate, the crystalline silicon covers the vertical sidewalls of the memory holes near the substrate; forming a memory cell film on the vertical sidewalls of the plurality of memory holes above the crystalline silicon; etching a slit in the stack of alternating layers of silicon oxide and silicon nitride; removing the layers of the silicon nitride to form recesses, a first recess of the recesses exposes the crystalline silicon; introducing a dopant into the slit and into the first recess to dope the crystalline silicon; forming a conductive material in the recesses, the conductive material in the recesses serving as word lines for NAND strings formed in the memory holes and as control gates for source side select transistors of the NAND strings; and forming a conductive material in the slit down to the substrate, the conductive material in the slit down to the substrate serving as a source line for the NAND strings.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A method of fabricating non-volatile storage, the method comprising:
    forming a stack of alternating layers of a first material and a second material over a substrate, the first material having an etch selectively with respect to the second material;
    creating a first opening through the stack of alternating layers;
    forming a semiconductor in the first opening;
    creating a second opening in the stack of alternating layers of the first material and the second material;
    removing a layer of the second material to form a recess that exposes a sidewall of the semiconductor;
    introducing a dopant into the recess by way of the second opening to dope the semiconductor; and
    forming a control gate in the recess for a transistor, the doped semiconductor serving as a body for the transistor.

2. The method of claim 1, wherein the forming the semiconductor in the first opening comprises:
    forming crystalline silicon in the first opening.

3. The method of claim 1, wherein the forming the semiconductor in the first opening comprises:
    epitaxially growing crystalline silicon in the first opening upwards from the substrate.

4. The method of claim 1, wherein the introducing the dopant into the second opening and into the recess to dope the semiconductor comprises:
    performing gas phase doping.

5. The method of claim 1, wherein the introducing the dopant into the second opening and into the recess to dope the semiconductor comprises:
    performing boron gas phase doping.

6. The method of claim 1, wherein the introducing the dopant into the second opening and into the recess to dope the semiconductor comprises:
    performing monolayer doping.

7. The method of claim 1, wherein the introducing the dopant into the second opening and into the recess to dope the semiconductor comprises:
    performing plasma doping.

8. The method of claim 1, further comprising:
    forming a memory cell film for memory cells of a NAND string in the first opening, the transistor being a select transistor of the NAND string.

9. The method of claim 8, further comprising:
    forming a conductive layer in the second opening down to the substrate, the conductive layer serving as a source line for the NAND string, wherein the select transistor couples the NAND string to the source line.

10. The method of claim 9, wherein the dopant has a first type of conductivity, further comprising:
    doping a portion of the substrate below the second opening with a dopant having a second type of conductivity, wherein the portion of the substrate below the second opening is exposed when introducing the dopant having the first type of conductivity into the second opening, wherein after doping the portion of the substrate below the second opening with the dopant having the second type of conductivity and after introducing the dopant having the first type of conductivity into the second opening the portion of the substrate below the second opening has a net doping of the second type of conductivity.

11. The method of claim 8, further comprising:
    forming a first conductive layer on substrate, wherein the select transistor couples the NAND string to the first conductive layer on substrate; and
    forming a second conductive layer in the second opening down to the first conductive layer, the first and second conductive layers serving as a source line for the NAND string.

12. A method of fabricating three-dimensional NAND, the method comprising:
    forming a stack of alternating horizontal layers of a first material and a second material over a substrate, the first material having an etch selectively with respect to the second material;
    etching a vertical memory hole through the stack of alternating horizontal layers, the vertical memory hole having a vertical sidewall;
    forming silicon for a body of a source side select transistor for a NAND string in the vertical memory hole, the silicon covers the vertical sidewall of the memory hole near the substrate;
    forming a memory cell film on the vertical sidewall of the memory hole above the silicon for the body, the memory cell film for memory cells of the NAND string;
    etching a vertical opening in the stack of alternating horizontal layers;
    etching away the horizontal layers of the second material to form horizontal recesses in the stack, a first of the horizontal recesses exposes the silicon for the body of the source side select transistor;
    introducing a dopant into the first horizontal recess by way of the vertical opening to dope the body of the source side select transistor; and
    forming a conductive material in the horizontal recesses, the conductive material serving as control gates of the memory cells of the NAND string and as a control gate of the source side select transistor of the NAND string.

13. The method of claim 12, wherein the forming silicon for the body of the source side select transistor comprises:
forming crystalline silicon in the vertical memory hole.

14. The method of claim 12, wherein the forming silicon for the body of the source side select transistor comprises:
epitaxially growing crystalline silicon in the vertical memory hole upwards from the substrate.

15. The method of claim 12, wherein the introducing a dopant into the vertical opening and into the first horizontal recess to dope the body of the source side select transistor comprises one of:
performing gas phase doping;
performing monolayer doping; or
performing plasma doping.

16. The method of claim 12, further comprising:
forming a conductive layer in the vertical opening down to the substrate, the conductive layer serving as a source line for the NAND string, wherein the source side select transistor couples the NAND string to the source line.

17. A method of fabricating non-volatile storage, the method comprising:
forming a stack of alternating layers of silicon oxide and silicon nitride over a substrate;
etching a plurality of memory holes through the alternating layers of silicon oxide and silicon nitride, the memory holes each having a vertical sidewall;
growing crystalline silicon in the plurality of memory holes upwards from the substrate, the crystalline silicon covers the vertical sidewalls of the memory holes near the substrate;
forming a memory cell film on the vertical sidewalls of the plurality of memory holes above the crystalline silicon;
etching a slit in the stack of alternating layers of silicon oxide and silicon nitride;
removing the layers of the silicon nitride to form recesses, a first recess of the recesses exposes the crystalline silicon;
introducing a dopant into the slit and into the first recess to dope the crystalline silicon;
forming a conductive material in the recesses, the conductive material in the recesses serving as word lines for NAND strings formed in the memory holes and as control gates for source side select transistors of the NAND strings; and
forming a conductive material in the slit down to the substrate, the conductive material in the slit down to the substrate serving as a source line for the NAND strings.

18. The method of fabricating non-volatile storage of claim 17, wherein the dopant that is introduced into the slit and into the first recess to dope the crystalline silicon is a first dopant having a first type of conductivity, further comprising:
introducing a second dopant having a second type of conductivity into the slit to dope the substrate below the slit.

19. The method of fabricating non-volatile storage of claim 18, wherein after introducing the second dopant into the slit to dope the substrate below the slit and after introducing the dopant into the slit and into the first recess to dope the crystalline silicon the substrate below the slit has a net doping of the second type of conductivity.

20. The method of fabricating non-volatile storage of claim 17, wherein the growing crystalline silicon in the plurality of memory holes upwards from the substrate, comprises:
epitaxially growing crystalline silicon up to a level above where the first recess will be formed, wherein the dopant is concentrated in the crystalline silicon near the level of the first recess and has a gradually lower concentration moving upwards from the level of the first recess.

* * * * *